(12) United States Patent
Santhamma et al.

(10) Patent No.: US 12,613,286 B2
(45) Date of Patent: Apr. 28, 2026

(54) SYSTEM AND METHOD FOR BATTERY PARAMETER RECHARACTERIZATION

(71) Applicant: Garrett Transportation I Inc., Torrance, CA (US)

(72) Inventors: Abhijith Vikraman Pillai Santhamma, Prague (CZ); Tomas Poloni, Malinovo (SK)

(73) Assignee: GARRETT TRANSPORTATION I INC., Torrance, CA (US)

( * ) Notice: Subject to any disclaimer, the term of this patent is extended or adjusted under 35 U.S.C. 154(b) by 136 days.

(21) Appl. No.: 18/419,294

(22) Filed: Jan. 22, 2024

(65) Prior Publication Data

US 2025/0237707 A1    Jul. 24, 2025

(51) Int. Cl.
| | |
|---|---|
| *G01R 31/392* | (2019.01) |
| *G01R 31/367* | (2019.01) |
| *G01R 31/385* | (2019.01) |
| *G01R 31/387* | (2019.01) |
| *H01M 10/42* | (2006.01) |
| *H01M 50/249* | (2021.01) |

(52) U.S. Cl.
CPC ......... *G01R 31/392* (2019.01); *G01R 31/367* (2019.01); *G01R 31/386* (2019.01); *G01R 31/387* (2019.01); *H01M 10/425* (2013.01); *H01M 50/249* (2021.01); *H01M 2010/4271* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 6,075,346 A | 6/2000 | Kikuchi et al. |
| 6,154,011 A | 11/2000 | Lam et al. |
| 6,300,763 B1 | 10/2001 | Kwok |
| 6,388,447 B1 | 5/2002 | Hall et al. |
| 6,674,265 B2 | 1/2004 | Yoshida et al. |

(Continued)

FOREIGN PATENT DOCUMENTS

| | | |
|---|---|---|
| DE | 10158029 A1 | 6/2002 |
| DE | 102010023730 A1 | 1/2011 |

(Continued)

OTHER PUBLICATIONS

Al Faruque, et al., "Modeling, Analysis, and Optimization of Electric Vehicle HVAC Systems," IEEE, pp. 423-428, 6 pages. 2016.

(Continued)

*Primary Examiner* — Jas A Sanghera
(74) *Attorney, Agent, or Firm* — BelayIP

(57) ABSTRACT

Methods and systems for estimating a battery parameter for a rechargeable battery. A sequence of a first zero current period, a first battery measurement of the first battery circuit, delivery of a known quantity of charge to the first battery circuit, a second zero current period, and a second battery measurement is performed. The known quantity of charge may be obtained from various sources. The battery parameter is estimated using an inverted open circuit voltage model, the first and second battery voltage measurements, and the known quantity of charge. The battery parameter may be a battery capacity and/or battery state of health.

19 Claims, 12 Drawing Sheets

(56) References Cited

U.S. PATENT DOCUMENTS

| | | |
|---|---|---|
| 7,545,146 B2 | 6/2009 | Klang et al. |
| 7,647,788 B2 | 1/2010 | Okuda et al. |
| 7,847,557 B2 | 12/2010 | Yun et al. |
| 8,082,743 B2 | 12/2011 | Hermann et al. |
| 8,344,697 B2 | 1/2013 | Lienkamp et al. |
| 8,410,760 B2 | 4/2013 | Formanski et al. |
| 8,417,403 B2 | 4/2013 | Iida et al. |
| 8,527,122 B2 | 9/2013 | Yamada et al. |
| 8,554,473 B2 | 10/2013 | Arcot et al. |
| 8,594,918 B2 | 11/2013 | Meyer-Ebeling et al. |
| 8,754,614 B2 | 6/2014 | Paryani et al. |
| 8,838,318 B2 | 9/2014 | Segawa et al. |
| 8,849,598 B2 | 9/2014 | Mingant et al. |
| 8,872,517 B2 | 10/2014 | Philbrook et al. |
| 9,014,959 B2 | 4/2015 | Kanno et al. |
| 9,079,507 B2 | 7/2015 | Smith et al. |
| 9,132,746 B2 | 9/2015 | Enomoto et al. |
| 9,139,095 B2 | 9/2015 | Kim |
| 9,197,078 B2 | 11/2015 | Lee |
| 9,217,779 B2 | 12/2015 | Xu et al. |
| 9,267,993 B2 | 2/2016 | Farmer et al. |
| 9,328,945 B2 | 5/2016 | Arai et al. |
| 9,358,898 B2 | 6/2016 | Endo et al. |
| 9,535,132 B2 | 1/2017 | Inguva et al. |
| 9,586,579 B1 | 3/2017 | Laskowsky et al. |
| 9,643,469 B2 | 5/2017 | Kakehashi et al. |
| 9,893,394 B2 | 2/2018 | Shin et al. |
| 9,897,664 B2 | 2/2018 | You et al. |
| 10,000,138 B2 | 6/2018 | Tanaka |
| 10,099,569 B2 | 10/2018 | Lindemann et al. |
| 10,107,864 B2 | 10/2018 | Vidhi et al. |
| 10,160,340 B2 | 12/2018 | Lindemann et al. |
| 10,180,460 B1 | 1/2019 | Castelaz |
| 10,209,314 B2 | 2/2019 | Garcia et al. |
| 10,386,422 B2 | 8/2019 | Christensen et al. |
| 10,388,998 B2 | 8/2019 | Choi et al. |
| 10,415,986 B2 | 9/2019 | Meyer et al. |
| 10,471,847 B1 | 11/2019 | Han et al. |
| 10,481,623 B1 | 11/2019 | Forouzan et al. |
| 10,527,678 B2 | 1/2020 | Lee |
| 10,539,621 B2 | 1/2020 | Chow et al. |
| 10,566,817 B2 | 2/2020 | Tkachenko et al. |
| 10,585,146 B2 | 3/2020 | Christensen et al. |
| 10,598,735 B2 | 3/2020 | Lee |
| 10,672,199 B2 | 6/2020 | Landolsi et al. |
| 10,730,401 B2 | 8/2020 | Jin et al. |
| 10,759,303 B2 | 9/2020 | Duan et al. |
| 10,892,631 B2 | 1/2021 | Barsukov et al. |
| 10,931,128 B2 | 2/2021 | Basu et al. |
| 10,962,599 B2 | 3/2021 | Petrucelli |
| 10,989,761 B2 | 4/2021 | Montaru |
| 11,075,414 B2 | 7/2021 | Yokotsuji et al. |
| 11,084,398 B2 | 8/2021 | Marcicki et al. |
| 11,085,969 B2 | 8/2021 | Drees |
| 11,204,391 B2 | 12/2021 | Wampler et al. |
| 11,280,840 B2 | 3/2022 | Chevrier et al. |
| 11,283,103 B2 | 3/2022 | Hong et al. |
| 11,300,620 B2 | 4/2022 | Chen et al. |
| 11,300,626 B2 | 4/2022 | Wampler et al. |
| 11,355,740 B2 | 6/2022 | Holme et al. |
| 11,397,210 B1 | 7/2022 | Peter et al. |
| 11,417,916 B2 | 8/2022 | Duan et al. |
| 11,428,747 B2 | 8/2022 | Ukumori |
| 11,435,405 B2 | 9/2022 | Gong et al. |
| 11,465,529 B1 | 10/2022 | Palombini |
| 11,545,839 B2 | 1/2023 | Sampson et al. |
| 11,567,140 B2 | 1/2023 | Zappen et al. |
| 11,605,849 B2 | 3/2023 | Chuang |
| 11,664,486 B2 | 5/2023 | Xue et al. |
| 11,695,184 B2 | 7/2023 | Roddy et al. |
| 11,703,548 B2 | 7/2023 | Yezerets et al. |
| 11,735,779 B2 | 8/2023 | Junger et al. |
| 2006/0091857 A1 | 5/2006 | Nakanishi et al. |
| 2008/0221787 A1 | 9/2008 | Vavrus |
| 2009/0040033 A1 | 2/2009 | Uchida |
| 2009/0167253 A1 | 7/2009 | Muraoka et al. |
| 2009/0326749 A1 | 12/2009 | Uchida |
| 2010/0021798 A1 | 1/2010 | Kelly et al. |
| 2010/0049397 A1 | 2/2010 | Liu et al. |
| 2010/0324846 A1 | 12/2010 | Marsh et al. |
| 2011/0032110 A1 | 2/2011 | Taguchi |
| 2011/0077880 A1 | 3/2011 | Gering |
| 2011/0082621 A1 | 4/2011 | Berkobin et al. |
| 2011/0100735 A1 | 5/2011 | Flett |
| 2011/0112781 A1 | 5/2011 | Anderson et al. |
| 2011/0156652 A1 | 6/2011 | Kishiyama et al. |
| 2011/0166810 A1 | 7/2011 | Grider et al. |
| 2011/0184600 A1 | 7/2011 | Kristinsson et al. |
| 2011/0238457 A1 | 9/2011 | Mason et al. |
| 2012/0004838 A1 | 1/2012 | Lee et al. |
| 2012/0029744 A1 | 2/2012 | Yun et al. |
| 2012/0101674 A1 | 4/2012 | Wang et al. |
| 2012/0116620 A1 | 5/2012 | Wang et al. |
| 2012/0116699 A1 | 5/2012 | Haag et al. |
| 2012/0136574 A1 | 5/2012 | Kobayashi et al. |
| 2012/0143413 A1 | 6/2012 | Cho et al. |
| 2012/0143435 A1 | 6/2012 | Cho et al. |
| 2012/0176231 A1 | 7/2012 | Skaff et al. |
| 2012/0179359 A1 | 7/2012 | Profitt-Brown et al. |
| 2012/0179395 A1 | 7/2012 | Gilman et al. |
| 2012/0232783 A1 | 9/2012 | Calkins et al. |
| 2013/0046428 A1 | 2/2013 | Jordan |
| 2013/0066498 A1 | 3/2013 | Nissato |
| 2013/0069660 A1 | 3/2013 | Bernard et al. |
| 2013/0073113 A1 | 3/2013 | Wang et al. |
| 2013/0079962 A1 | 3/2013 | Ishikawa et al. |
| 2013/0096858 A1 | 4/2013 | Amano et al. |
| 2013/0113424 A1 | 5/2013 | Froelich |
| 2013/0116868 A1 | 5/2013 | Erko et al. |
| 2013/0147432 A1 | 6/2013 | Yamamoto et al. |
| 2013/0151046 A1 | 6/2013 | Choi et al. |
| 2013/0151056 A1 | 6/2013 | Nakano |
| 2013/0169232 A1 | 7/2013 | Middleton et al. |
| 2013/0238189 A1 | 9/2013 | Michaelis |
| 2013/0268152 A1 | 10/2013 | Koshizen et al. |
| 2013/0311016 A1 | 11/2013 | Kim |
| 2013/0317690 A1 | 11/2013 | Fujita et al. |
| 2013/0325335 A1 | 12/2013 | Kee et al. |
| 2013/0332013 A1 | 12/2013 | Malone et al. |
| 2014/0005855 A1 | 1/2014 | Hu et al. |
| 2014/0014421 A1 | 1/2014 | Carpenter et al. |
| 2014/0023905 A1 | 1/2014 | Taniyama et al. |
| 2014/0025255 A1 | 1/2014 | Xiaoli |
| 2014/0028681 A1 | 1/2014 | Hirayama |
| 2014/0046595 A1 | 2/2014 | Segawa et al. |
| 2014/0074329 A1 | 3/2014 | Yang et al. |
| 2014/0143002 A1 | 5/2014 | Aisu |
| 2014/0163854 A1 | 6/2014 | Matsumoto et al. |
| 2014/0172282 A1 | 6/2014 | Feng et al. |
| 2014/0188304 A1 | 7/2014 | Richter et al. |
| 2014/0210415 A1 | 7/2014 | Ohmori |
| 2014/0266059 A1 | 9/2014 | Li et al. |
| 2014/0306519 A1 | 10/2014 | Song |
| 2014/0326430 A1 | 11/2014 | Carpenter et al. |
| 2014/0336965 A1 | 11/2014 | Mori et al. |
| 2014/0338376 A1 | 11/2014 | Carpenter et al. |
| 2015/0002105 A1 | 1/2015 | Kelly |
| 2015/0079433 A1 | 3/2015 | Tamai et al. |
| 2015/0147608 A1 | 5/2015 | Lin et al. |
| 2015/0165919 A1 | 6/2015 | Hughes |
| 2015/0180090 A1 | 6/2015 | Duan |
| 2015/0183293 A1 | 7/2015 | Kim |
| 2015/0258907 A1 | 9/2015 | Lee |
| 2015/0266390 A1 | 9/2015 | Shin et al. |
| 2015/0329003 A1 | 11/2015 | Li et al. |
| 2015/0346285 A1* | 12/2015 | Igarashi ............... G01R 31/392 |
| | | 324/432 |
| 2015/0349385 A1 | 12/2015 | Hu et al. |
| 2016/0016564 A1 | 1/2016 | Otake et al. |
| 2016/0061610 A1 | 3/2016 | Meyer et al. |
| 2016/0137090 A1 | 5/2016 | Nam et al. |
| 2016/0146895 A1 | 5/2016 | Yazami |
| 2016/0172886 A1 | 6/2016 | Keates |
| 2016/0176309 A1 | 6/2016 | Jeon et al. |

(56)　　　　References Cited

U.S. PATENT DOCUMENTS

| | | |
|---|---|---|
| 2016/0209472 A1 | 7/2016 | Chow et al. |
| 2016/0229411 A1 | 8/2016 | Murata |
| 2016/0238666 A1 | 8/2016 | Kelly |
| 2016/0239592 A1 | 8/2016 | Pourmousavi Kani |
| 2016/0243941 A1 | 8/2016 | Kishida |
| 2016/0285284 A1 | 9/2016 | Matlapudi et al. |
| 2016/0301114 A1 | 10/2016 | Izumi et al. |
| 2016/0311330 A1 | 10/2016 | Liu |
| 2016/0318499 A1 | 11/2016 | Yamanaka et al. |
| 2016/0332505 A1 | 11/2016 | Yamanaka et al. |
| 2016/0351981 A1 | 12/2016 | Porras et al. |
| 2016/0363632 A1 | 12/2016 | Park et al. |
| 2016/0375782 A1 | 12/2016 | Liu |
| 2017/0003352 A1 | 1/2017 | Barre et al. |
| 2017/0028912 A1 | 2/2017 | Yang et al. |
| 2017/0067966 A1 | 3/2017 | Min |
| 2017/0088000 A1 | 3/2017 | Payne et al. |
| 2017/0088008 A1 | 3/2017 | Melendez et al. |
| 2017/0092992 A1 | 3/2017 | Duan |
| 2017/0120774 A1 | 5/2017 | Obata |
| 2017/0120775 A1 | 5/2017 | Murata et al. |
| 2017/0129361 A1 | 5/2017 | Scaringe |
| 2017/0133731 A1 | 5/2017 | Hermann |
| 2017/0259687 A1 | 9/2017 | Chikkannanavar et al. |
| 2017/0282739 A1 | 10/2017 | Cha et al. |
| 2017/0305292 A1 | 10/2017 | Minamiura et al. |
| 2017/0352203 A1 | 12/2017 | Jansson |
| 2017/0352930 A1 | 12/2017 | Masias et al. |
| 2018/0053965 A1 | 2/2018 | Marcicki et al. |
| 2018/0118033 A1 | 5/2018 | Lu et al. |
| 2018/0128881 A1 | 5/2018 | Kelly |
| 2018/0226695 A1 | 8/2018 | Miyaki et al. |
| 2018/0236898 A1 | 8/2018 | Ji |
| 2018/0241234 A1 | 8/2018 | Liang et al. |
| 2018/0248396 A1 | 8/2018 | Keates |
| 2018/0287227 A1 | 10/2018 | Jeong et al. |
| 2018/0304765 A1 | 10/2018 | Newman et al. |
| 2018/0340983 A1 | 11/2018 | Li et al. |
| 2019/0043270 A1 | 2/2019 | Hemes et al. |
| 2019/0084399 A1 | 3/2019 | Ohara et al. |
| 2019/0140327 A1 | 5/2019 | Fukada et al. |
| 2019/0176639 A1 | 6/2019 | Kumar et al. |
| 2019/0187212 A1 | 6/2019 | Garcia et al. |
| 2019/0197580 A1 | 6/2019 | Harty |
| 2019/0285704 A1 | 9/2019 | Lee |
| 2020/0011932 A1 | 1/2020 | Hooshmand et al. |
| 2020/0079390 A1 | 3/2020 | Jun et al. |
| 2020/0160619 A1 | 5/2020 | Wang et al. |
| 2020/0198495 A1 | 6/2020 | Rizzoni et al. |
| 2020/0203780 A1 | 6/2020 | Mandli et al. |
| 2020/0212515 A1 | 7/2020 | King et al. |
| 2020/0251788 A1 | 8/2020 | Sood et al. |
| 2020/0300920 A1 | 9/2020 | Christophersen et al. |
| 2021/0016664 A1 | 1/2021 | Deng et al. |
| 2021/0031654 A1 | 2/2021 | Vizzini et al. |
| 2021/0053450 A1 | 2/2021 | Oh et al. |
| 2021/0101504 A1 | 4/2021 | Okamoto et al. |
| 2021/0131812 A1 | 5/2021 | Gong et al. |
| 2021/0138927 A1 | 5/2021 | Maeng et al. |
| 2021/0143391 A1 | 5/2021 | Wood, III et al. |
| 2021/0175547 A1 | 6/2021 | Dahn et al. |
| 2021/0180967 A1 | 6/2021 | Chae et al. |
| 2021/0215628 A1 | 7/2021 | Christophersen |
| 2021/0242518 A1 | 8/2021 | Shrivastava et al. |
| 2021/0273270 A1 | 9/2021 | Fujikawa et al. |
| 2021/0284179 A1 | 9/2021 | Diamond et al. |
| 2021/0300197 A1 | 9/2021 | Yi |
| 2021/0309196 A1 | 10/2021 | Son et al. |
| 2021/0328449 A1 | 10/2021 | Li et al. |
| 2021/0344212 A1 | 11/2021 | Jee et al. |
| 2021/0354591 A1 | 11/2021 | Iida et al. |
| 2021/0359317 A1 | 11/2021 | Kaushik et al. |
| 2021/0379999 A1 | 12/2021 | Yang et al. |
| 2021/0382115 A1 | 12/2021 | Woll et al. |
| 2021/0382473 A1 | 12/2021 | Stano et al. |

| | | |
|---|---|---|
| 2021/0384753 A1 | 12/2021 | Kozuma et al. |
| 2022/0009367 A1 | 1/2022 | Lee et al. |
| 2022/0057451 A1 | 2/2022 | Viswanathan et al. |
| 2022/0091062 A1 | 3/2022 | Gullapalli et al. |
| 2022/0097557 A1 | 3/2022 | Lee et al. |
| 2022/0105829 A1 | 4/2022 | Nakagawa |
| 2022/0114519 A1 | 4/2022 | Hencken et al. |
| 2022/0131400 A1 | 4/2022 | Nakao et al. |
| 2022/0137149 A1 | 5/2022 | Crane et al. |
| 2022/0149645 A1 | 5/2022 | Ramanujam et al. |
| 2022/0158167 A1 | 5/2022 | Xiao et al. |
| 2022/0166017 A1 | 5/2022 | Su et al. |
| 2022/0221516 A1 | 7/2022 | Lee et al. |
| 2022/0244317 A1 | 8/2022 | Oji |
| 2022/0263144 A1 | 8/2022 | Xie et al. |
| 2022/0268851 A1 | 8/2022 | Epureanu et al. |
| 2022/0336809 A1 | 10/2022 | Choi |
| 2022/0343702 A1 | 10/2022 | Pekar et al. |
| 2022/0381835 A1 | 12/2022 | Yang et al. |
| 2022/0407324 A1 | 12/2022 | Jung et al. |
| 2023/0009045 A1 | 1/2023 | Kang |
| 2023/0009288 A1 | 1/2023 | Kang |
| 2023/0015952 A1 | 1/2023 | Kosyakov |
| 2023/0064240 A1 | 3/2023 | Zhou et al. |
| 2023/0093445 A1 | 3/2023 | Kim et al. |
| 2023/0105040 A1 | 4/2023 | Wienhausen et al. |
| 2023/0152385 A1 | 5/2023 | Richter et al. |
| 2023/0173946 A1 | 6/2023 | Foland |
| 2024/0132047 A1 | 4/2024 | Herceg et al. |
| 2024/0132048 A1 | 4/2024 | Dolisnsky et al. |
| 2024/0132066 A1 | 4/2024 | Vosahlik et al. |
| 2024/0262242 A1 | 8/2024 | Poloni |

FOREIGN PATENT DOCUMENTS

| | | |
|---|---|---|
| DE | 102011116516 A1 | 4/2012 |
| DE | 102014201349 A1 | 7/2015 |
| DE | 102014201357 A1 | 7/2015 |
| DE | 102017103730 A1 | 9/2017 |
| EP | 2631663 A1 | 8/2013 |
| EP | 2660615 A1 | 11/2013 |
| EP | 2661382 A1 | 11/2013 |
| EP | 2963433 A1 | 1/2016 |
| EP | 3234506 A1 | 10/2017 |
| EP | 3279679 A1 | 2/2018 |
| EP | 1922781 B1 | 4/2018 |
| EP | 3499634 A1 | 6/2019 |
| EP | 3706280 A1 | 9/2020 |
| EP | 3806270 A1 | 4/2021 |
| EP | 3878706 A1 | 9/2021 |
| EP | 4010220 A1 | 6/2022 |
| EP | 4094084 A1 | 11/2022 |
| EP | 4138170 A1 | 2/2023 |
| EP | 4174504 A1 | 5/2023 |
| EP | 4199178 A1 | 6/2023 |
| WO | 2005039919 A1 | 5/2005 |
| WO | 2009020217 A1 | 2/2009 |
| WO | 2010055271 A1 | 5/2010 |
| WO | 2011001609 A1 | 1/2011 |
| WO | 2011072564 A1 | 6/2011 |
| WO | 2012087018 A2 | 6/2012 |
| WO | 2012091076 A1 | 7/2012 |
| WO | 2012140835 A1 | 10/2012 |
| WO | 2013157214 A1 | 10/2013 |
| WO | 2014185163 A1 | 11/2014 |
| WO | 2015045505 A1 | 4/2015 |
| WO | 2015110602 A1 | 7/2015 |
| WO | 2015110603 A1 | 7/2015 |
| WO | 2015174279 A1 | 11/2015 |
| WO | 2016086182 A2 | 6/2016 |
| WO | 2017071657 A1 | 5/2017 |
| WO | 2018079164 A1 | 5/2018 |
| WO | 2018104314 A1 | 6/2018 |
| WO | 2018112818 A1 | 6/2018 |
| WO | 2018192190 A1 | 10/2018 |
| WO | 2019018974 A1 | 1/2019 |
| WO | 2019113828 A1 | 6/2019 |
| WO | 2019138731 A1 | 7/2019 |
| WO | 2019163398 A1 | 8/2019 |

(56) References Cited

FOREIGN PATENT DOCUMENTS

| | | | |
|---|---|---|---|
| WO | 2019181311 A1 | 9/2019 |
| WO | 2019218769 A1 | 11/2019 |
| WO | 2019243157 A1 | 12/2019 |
| WO | 2020041767 A1 | 2/2020 |
| WO | 2020051738 A1 | 3/2020 |
| WO | 2020080690 A1 | 4/2020 |
| WO | 2020131948 A1 | 6/2020 |
| WO | 2020135481 A1 | 7/2020 |
| WO | 2020153190 A1 | 7/2020 |
| WO | 2020191800 A1 | 10/2020 |
| WO | 2020241001 A1 | 12/2020 |
| WO | 2020259225 A1 | 12/2020 |
| WO | 2021014406 A1 | 1/2021 |
| WO | 2021044132 A1 | 3/2021 |
| WO | 2021044134 A1 | 3/2021 |
| WO | 2021118170 A1 | 6/2021 |
| WO | 2021134746 A1 | 7/2021 |
| WO | 2021181536 A1 | 9/2021 |
| WO | 2021185308 A1 | 9/2021 |
| WO | 2021217662 A1 | 11/2021 |
| WO | 2021229070 A1 | 11/2021 |
| WO | 2021229072 A1 | 11/2021 |
| WO | 2022001977 A1 | 1/2022 |
| WO | 2022024848 A1 | 2/2022 |
| WO | 2022024885 A1 | 2/2022 |
| WO | 2022026336 A1 | 2/2022 |
| WO | 2022056486 A1 | 3/2022 |
| WO | 2022065813 A1 | 3/2022 |
| WO | 2022096898 A2 | 5/2022 |
| WO | 2022111563 A1 | 6/2022 |
| WO | 2022119524 A1 | 6/2022 |
| WO | 2022126254 A1 | 6/2022 |
| WO | 2022138745 A1 | 6/2022 |
| WO | 2022143129 A1 | 7/2022 |
| WO | 2022169652 A1 | 8/2022 |
| WO | 2022170671 A1 | 8/2022 |
| WO | 2022174698 A1 | 8/2022 |
| WO | 2022175146 A1 | 8/2022 |
| WO | 2022231062 A1 | 11/2022 |
| WO | 2022244008 A1 | 11/2022 |
| WO | 2022247991 A1 | 12/2022 |
| WO | 2022251026 A2 | 12/2022 |
| WO | 2022268362 A1 | 12/2022 |
| WO | 2022269538 A1 | 12/2022 |
| WO | 2023284453 A1 | 1/2023 |
| WO | 2023035074 A1 | 3/2023 |
| WO | 2023059652 A1 | 4/2023 |
| WO | 2023066469 A1 | 4/2023 |
| WO | 2023072110 A1 | 5/2023 |
| WO | 2023078590 A1 | 5/2023 |
| WO | 2023080633 A1 | 5/2023 |
| WO | 2023124913 A1 | 7/2023 |

OTHER PUBLICATIONS

Amini et al., "Hierarchical MPC for Robust Eco-Cooling of Connected and Automated Vehicles and Its Application to Electric Vehicle Battery Thermal Management," IEEE, 13 pages. 2020.

Dedek et al., BEV Remaining Range Estimation Based on Modern Control Theory-Initial Study, IFAC-Papers Online, vol. 52, Issue 27, pp. 86-91. 2019.

Hamut et al., "Exergy analysis of a TMS (thermal management system) for range-extended EVs (electric vehicles)," Elsevier Journal, pp. 117-125, 9 pages. Feb. 4, 2012.

Heiskanen, et al., "Generation and Evolution of the Solid Electrolyte Interphase of Lithium-Ion Batteries," Joule 3, pp. 2322-2333, 11 pages. Oct. 16, 2019.

Jog et al., "Dynamic Energy Modeling of Battery Climate System in an Electric Vehicle," Chalmers University of Technology, 78 pages. 2017.

Lahlou, "Energy and Thermal Comfort Management Strategies for Battery Electric Vehicles," Sorbonne University/HAL Open Science, 153 pages. Jun. 2, 2021.

Malmir et al., "A Heuristic Supervisory Controller for a 48V Hybrid Electric Vehicle Considering Fuel Economy and Battery Aging." SAE International by Clemson University Libraries, 10 pages, Jan. 20, 2019.

Murashko Kirill et al., "Modelling of the Battery Pack Thermal Management System for Hybrid Electric Vehicles," Lappeenranta University of Technology/IEEE, 10 pages. Aug. 2014.

Nguyen et al., "Model Selection for Degradation Modeling and Prognosis with Health Monitoring Data," Reliability Engineering and System Safety, vol. 169, pp. 105-116. 2018.

Partial European Search Report for International Application No. 222034290, dated Jul. 18, 2023. (14 Pages).

International Search Report and Written Opinion for International Application No. PCT/US2024/0141149, dated May 21, 2024. (18 Pages).

Randall et al., "Controls Oriented Reduced Order Modeling of Lithium Deposition on Overcharge," Journal of Power Resources. vol. 209, pp. 318-325. Available Online Mar. 7, 2012.

Prasek et al., "Range control MPC with application to Vapor Compression Cycles," Elsevier Journal, 14 pages. Jan. 2020.

Sarvaiya et al., "Comparative Analysis of Hybrid Vehicle Energy Mangagement Strategies with Optimisation of Fuel Economy and Battery Life," Energy, vol. 228, 27 Pages. Aug. 1, 2021.

Suri et al., "A Control-Oriented Cycle-Life Model for Hybrid Electric Vehicle Lithium-Ion Batteries," Energy, vol. 96, pp. 644-653. Available Online Feb. 4, 2016.

Wang et al., "A review on research status and key technologies of battery thermal management and its enhanced safety," Wiley International Journal of Energy Research, 26 pages. Jun. 2018.

Weustenfeld et al., "Heat flow rate based thermal management for electric vehicles using a secondary loop heating and cooling system," Audi AG, 15 pages.

Yan et al., "Battery thermal management strategy for electric vehicles based on nonlinear model predictive control," Elsevier Journal, pp. 1-11, 11 pages. Sep. 4, 2021.

U.S. Appl. No. 18/498,996, filed Oct. 31, 2023.

Azizghalehsari et al., "A Review of Lithium-Ion Batteries Diagnostics and Prognostic Challenges," 47th Annual Conference of the IEEE Industrial Electronics Society, 6 pages. 2021. Accessed Jan. 17, 2022.

Adany et al., "Switching Algorithms for Extending Battery Life in Electric Vehicles," Journal of Power Sources, vol. 231, pp. 50-59. 2013. Available Online Dec. 27, 2012.

WO-2019218769-A1 Machine Translation (Year: 2019).

Bibinsha et al., "Machine Learning Based Battery Aging Management Strategy for Electric Vehicles," 2021 Second International Conference on Electronics and Sustainable Communication Systems, IEEE Xplore, 7 pages. Aug. 2021.

Chen et al., "A New State-of-Health Estimation Method for Lithium-Ion Batteries through the Intrinsic Relationship between Ohmic Internal Resistance and Capacity," Measurement, pp. 586-595, Feb. 2018.

Dong et al., "Lithium-Ion Battery State of Health Monitoring and Remaining Useful Life Prediction Based on Support Vector Regression-Particle Filter," Journal of Power Sources, vol. 271, pp. 114-123. Available Online Aug. 6, 2014.

Barai et al., "A Study of the Influence of Measurement Timescale on Internal Resistance Characterisation Methodologies for Lithium-Ion Cells," Scientific Reports, vol. 8, No. 21, 13 Pages. Published Online Jan. 8, 2018.

Nacu et al., "Lithium-Ion Cell Characterization, using Hybrid Current Pulses, for Subsequent Battery Simulation in Mobility Applications," Processes, vol. 10, 10 Pages, Published Oct. 18, 2022.

Smith et al., "Lithium-Ion Battery Life Model with Electrode Cracking and Early-Life Break-in Process," Journal of the Electrochemical Society, vol. 168, 17 Pages. Published Oct. 22, 2021.

* cited by examiner

SYSTEM AND METHOD FOR BATTERY PARAMETER RECHARACTERIZATION

BACKGROUND

A battery management system (BMS) is used in a hybrid or all-electric vehicle to control and manage battery operation. The BMS controls safe operation of the battery of such a vehicle, and also enables estimations of the state of the battery. Such estimations can be highly useful to generate range predictions for the battery and to set boundary conditions for operation, including charging and discharging activities. There are several areas in which BMS can be updated or enhanced. A BMS may include a battery management unit (BMU) and one or more cell management units (CMUs).

Many current BMS models use look-up tables based on lab test data to characterize how a cell will perform under various conditions. However, this characterization of the battery changes as the battery ages. Sophisticated control techniques can be used to reduce errors due to aging. However, accuracy may be enhanced further if parameters can be re-characterized as needed, such as by testing batteries in the vehicle.

Because much of the current battery state data, particularly in relation to aging, is simply an estimate, it has been standard practice to select the boundaries of operating conditions conservatively. For example, during fast-charging event, temperatures, currents, and changes in charging parameters as the battery state of charge (SOC) increases, are all selected to provide wide margins between actual operations and conditions that could have damaging effects, such as causing excess Lithium plating. With better accuracy in the characterization of battery state, narrower margins may be enabled.

Certain battery chemistries add further challenges. For example, lithium iron phosphate (LFP) batteries are promising, having the potential for enhanced safety at lower cost than some other chemistries. However, LFP cells display voltage hysteresis and a flat SOC for a significant portion of the SOC/Open-Circuit Voltage curve. Range estimation errors may arise and are reported to be much higher with LFP than some other chemistries. Better estimation accuracy for LFP, and other chemistries, may advance wider adoption.

Electrochemical Impedance Spectroscopy (EIS) is a non-destructive technique for measuring electrical impedances of a material at multiple frequencies to obtain information about internal physical and chemical processes. EIS may be performed on a battery, for example. In a Potentiostatic EIS, a sinusoidal voltage perturbation can be applied to a device under test, and resultant current excitation is measured while testing is performed at several frequencies. In Galvanostatic EIS, a sinusoidal current perturbation is applied, and resulting potential is measured while testing is performed at several frequencies. Most systems for EIS are large, expensive, and not well suited for on-board use in a vehicle. New EIS systems, and new uses for such EIS systems, are desired. Moreover, of particular interest is the use of EIS for battery parameter characterization.

Overview

The present inventors have recognized that a problem to be solved is the need for new and/or alternative systems and methods for recharacterizing battery parameters over the life of a battery, including in an electric vehicle and/or other installation.

A first illustrative and non-limiting example takes the form of a method of estimating a first battery parameter for a first battery circuit in a battery pack, the battery pack also including a second battery circuit, the method comprising: with the first battery circuit at a first state of charge, enforcing a first zero current period in which the first battery circuit is neither charged nor discharged from the first state of charge; at the end of the first zero current period, obtaining a first battery voltage measurement from the first battery circuit; delivering to the first battery circuit a first known quantity of charge by issuing pulses of current to the first battery circuit from the second battery circuit; enforcing a second zero current period in which the first battery circuit is neither charged nor discharged; at the end of the second zero current period, obtaining a second battery voltage measurement from the first battery circuit; determining the first battery parameter using an inverted open circuit voltage model, the first and second battery voltage measurements, and the first known quantity of charge.

Additionally or alternatively, the method may also include determining a second battery parameter for the second battery circuit, the method comprising, after determining the first battery parameter: at the end of the second zero current period, obtaining a third battery voltage measurement from the second battery circuit, wherein the second battery circuit is neither charged nor discharged during the second zero current period; delivering to the second battery circuit a second known quantity of charge by issuing pulses of current from the first battery circuit to the second battery circuit; enforcing a third zero current period in which the second battery circuit is neither charged nor discharged; at the end of the third zero current period, obtaining a fourth battery voltage measurement from the second battery circuit; determining the second battery parameter using an inverted open circuit voltage model, the third and fourth battery voltage measurements, and the second known quantity of charge.

Additionally or alternatively, the first known quantity of charge is substantially equal to the second known quantity of charge. Additionally or alternatively, the first battery parameter is a battery state of health. Additionally or alternatively, the first battery parameter is a battery capacity. Additionally or alternatively, the first state of charge is known. Additionally or alternatively, the first state of charge is unknown.

Additionally or alternatively, the step of delivering to the first battery circuit a first known quantity of charge by issuing pulses of current to the first battery circuit from the second battery circuit is performed using a transformer having a primary and a secondary, wherein one of the first battery circuit and the second battery circuit is coupled to the primary, and the other is coupled to the secondary.

Another illustrative and non-limiting example takes the form of a method of estimating a battery parameter, the battery including at least a first battery circuit comprising one or more battery cells, the battery being a component of a vehicle having an electric motor drive and an onboard charging circuit configured to receive a power signal from a power source external to the vehicle and convert the power signal to a charging signal for use in charging the battery, the method comprising: with the first battery circuit at a first state of charge and with the vehicle coupled to power source, enforcing a first zero current period in which the first battery circuit is neither charged nor discharged from the first state of charge; at the end of the first zero current period, obtaining a first battery voltage measurement from the first battery circuit; delivering to the first battery circuit a known quantity of charge by issuing pulses of current to the first battery circuit from the onboard charging circuit; enforcing a second zero current period in which the first battery circuit is neither charged nor discharged; at the end of the second zero current period, obtaining a second battery voltage measurement from the first battery circuit; and determining the battery parameter for the first battery circuit using an inverted open circuit voltage model, the first and second battery voltage measurements, and the known quantity of charge.

Another example takes the form of a method of charging a battery comprising initiating as method as in the preceding example by, prior to the first zero current period, using the onboard charging circuit to charge the first battery circuit until a threshold battery voltage is reached, and then, in response to reaching the threshold battery voltage, initiating the above method for estimating the battery parameter.

Additionally or alternatively, the first battery circuit comprises the entire battery. Additionally or alternatively, the battery parameter is a battery state of health of the first battery circuit. Additionally or alternatively, the battery parameter is a battery capacity of the first battery circuit.

Another illustrative and non-limiting example takes the form of a method of estimating a battery parameter, the battery including at least a first battery circuit comprising one or more battery cells, the battery being a component of a vehicle having an electric motor drive, the vehicle being couplable to an external charger, the method comprising: with the first battery circuit at a first state of charge, enforcing a first zero current period in which the first battery circuit is neither charged nor discharged from the first state of charge; at the end of the first zero current period, obtaining a first battery voltage measurement from the first battery circuit; delivering to the first battery circuit a known quantity of charge by issuing pulses of current to the first battery circuit from the external charger; enforcing a second zero current period in which the first battery circuit is neither charged nor discharged; at the end of the second zero current period, obtaining a second battery voltage measurement from the first battery circuit; and determining the battery parameter for the first battery circuit using an inverted open circuit voltage model, the first and second battery voltage measurements, and the known quantity of charge.

Another example takes the form of a method of charging a battery comprising initiating the method of the preceding example by, prior to the first zero current period, using the external charger to charge the first battery circuit until a threshold battery voltage is reached, and then, in response to reaching the threshold battery voltage, initiating the method of estimating the battery parameter.

Additionally or alternatively, the first zero current period and the second zero current periods each occur with the vehicle coupled to the external charger. Additionally or alternatively, the battery parameter is a battery state of health of the first battery circuit. Additionally or alternatively, the battery parameter is a battery capacity of the first battery circuit.

Another illustrative and non-limiting example takes the form of a battery system comprising a battery pack having at least a first battery circuit comprising one or more cells and a battery management unit including a controller coupled to the battery pack, the battery management unit configured to perform any of the preceding methods. Additionally or alternatively the battery system may be part of a vehicle. Additionally or alternatively, the battery system and/or vehicle may include a charger configured for coupling to an external power source and for charging the battery pack.

Still further examples take the form of methods of operating an electrical architecture as in any of the preceding examples, and controller configured or adapted for performing such methods in associated with an electrical architecture as in any of the preceding examples.

This overview is intended to provide an introduction to the subject matter of the present patent application. It is not intended to provide an exclusive or exhaustive explanation. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
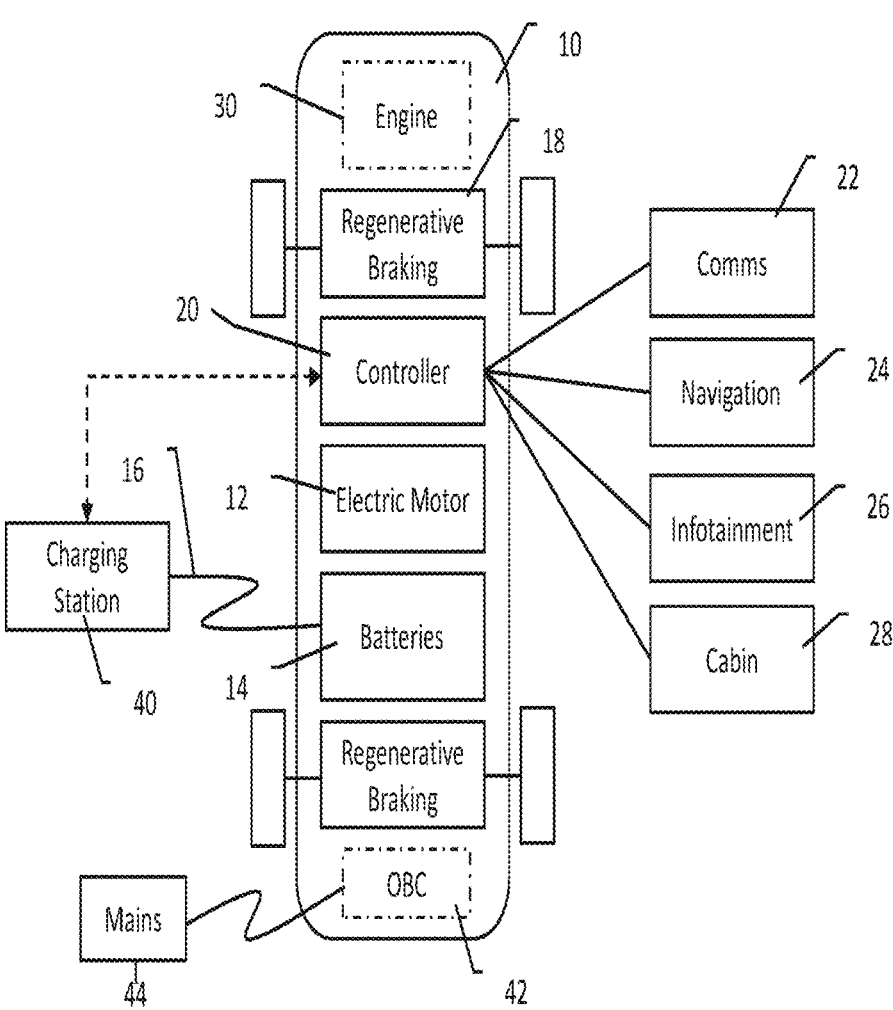
FIG. 1 is a block diagram of a vehicle having an electric drive motor.

FIG. 1 is a block diagram of a vehicle having an electric drive motor. The skilled person will recognize that, for brevity, the following discussion may not necessarily describe every feature that would be present in the vehicle 10. The vehicle 10 is characterized by an electric motor 12 (or plural electric motors 12) that provide motive force to the vehicle 10, powered by batteries 14. The batteries 14 may have any suitable chemistry. Batteries 14 may be associated with various secondary features, such as warming and/or cooling apparatuses to maintain suitable temperatures therein. Regenerative braking 18 may be provided, and serves to at least partly recharge the batteries 14 under suitable braking conditions.

A controller 20 is coupled to each of these blocks, and may further be linked to control blocks for communications 22, navigation 24, infotainment 26, and cabin 28. The controller 20 is configured for sending and receiving information as well as to provide and/or control power used by, for example, an air conditioning unit used for cooling the cabin 28, or other environmental controls for the cabin 28. The communications 22 may include any of satellite, cellular, Bluetooth, broadband, WiFi, and/or various other wireless communications circuits, antennae, receivers, transceivers, transmitters, etc., as desired. The communications 22 may allow the controller 20 to send and receive data relative to one or more internet, dedicated, and/or cloud-based data receiving and/or processing centers, such as a fleet monitor. The communications 22 may be used to upload and/or download data of various types.

The navigation system 24 may store, retrieve, receive, and/or display various types of data including, for example and without limitation, weather/environmental data, road data including curvature, posted speed limits, and grade, as well as traffic data, as desired. The navigation system 24 may also be used to provide route instructions to a driver of the vehicle, and/or to provide a route for an autonomous drive controller to use. The navigation system 24 may include a global positioning system (GPS) device for determining and tracking position of the vehicle 10.

The batteries 14 are rechargeable by connection 16 to an off-vehicle charging station 40. Batteries 14 may also be recharged using an on-board charger (OBC) 42 that plugs into mains power 44. The controller 20 may communicate with the charging station 40, as desired, to allow, for example, the controller 20 to provide or receive control or data signals during charging operations. For example, the controller 20 may indicate cell type for batteries 14, or may provide a charging current control signal to the charging station 40, if desired, so that the charging station 40 provides an appropriate amount of charge current. The controller 20 may also provide battery temperature signals, or readiness signals for high current charging, to the charging station. The controller 20 may also control the OBC 42. Some examples further discussed below allow the controller 20 to manipulate charging current as part of a battery parameter characterization procedure.

Several examples that follow focus on the batteries 14 and associated systems. While these examples may be mostly used in the context of an electric vehicle (EV) lacking another source of power, the present innovation may also be used in hybrid vehicles having a second power source, such as an internal combustion engine 30, or a fuel cell or other power source onboard. More pertinent than the choice of multiple power sources is the fact that the vehicle 10 includes a plurality of batteries 16 of size and capacity that will allow motive power to be generated by the electric motor 12. While a vehicle having wheels is illustrated, it should also be understood that the present invention may be used in aviation as well as in fixed installations having rechargeable batteries 14 in which reduced cost and relatively low power options for characterizing parameters of the batteries 14 is desired.

Figure 2:
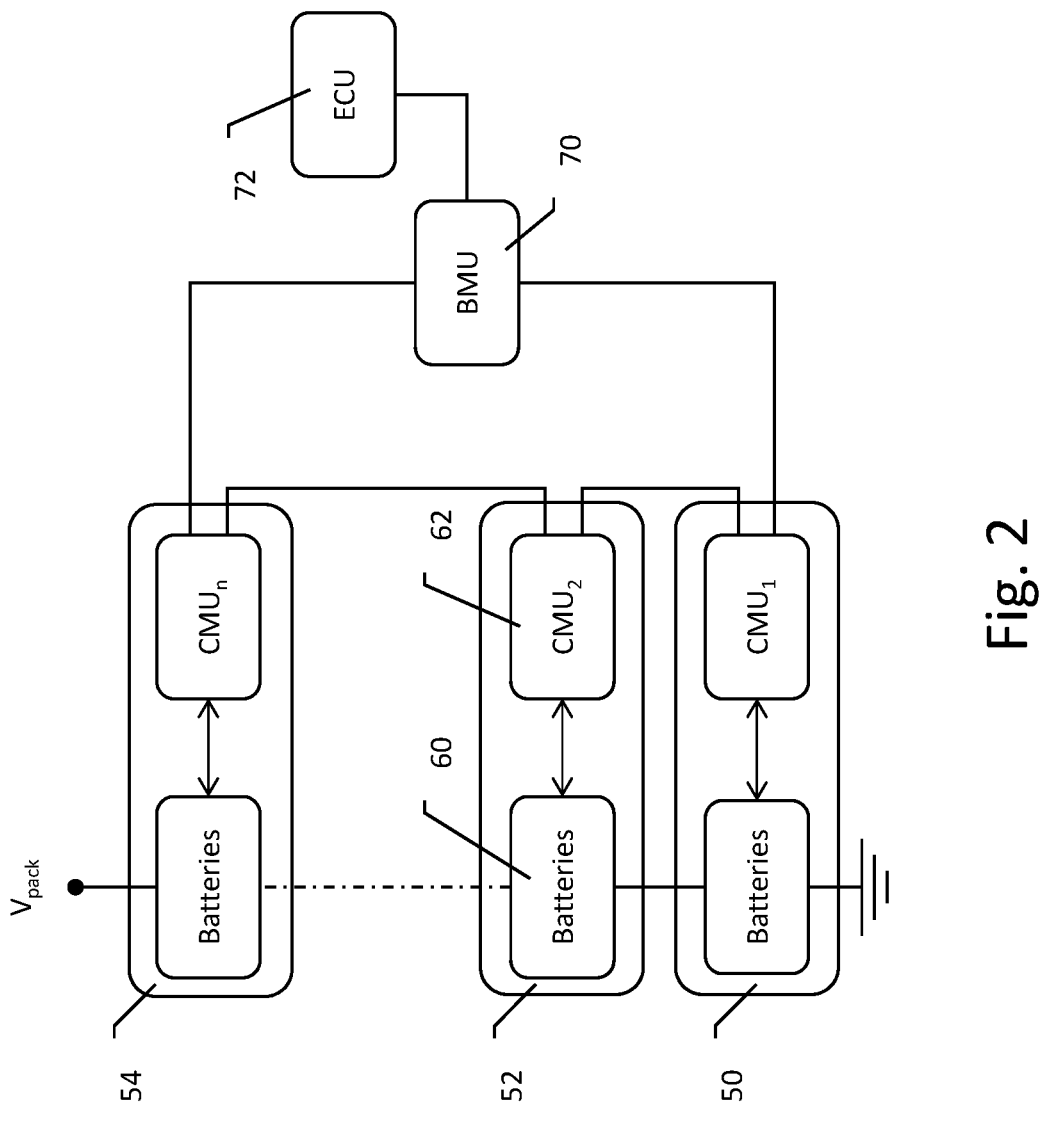
FIG. 2 is a block diagram of an illustrative battery architecture.

FIG. 2 is a block diagram of an illustrative battery architecture. The battery pack includes a plurality of modules 50, 52, 54, each having a set of batteries 60 and a cell management unit (CMU) 62. The batteries 60 in each module 50, 52, 54 may include a collection of cells in series and in parallel. The CMU 62 has circuitry and sensors for cell voltage measurement, temperature measurements and cell balancing, and is configured to monitor the cells and keep the module 52 in a safe operating region. Cell voltage may be sampled several times a second, for example, ten to one hundred times a second. Surface temperature may be sampled less frequently, for example, one to ten times a second, as temperature changes more slowly. A typical installation may have one temperature sensor for every two cells. Current flow may be monitored at the pack level in some systems.

Data gathered by the CMU 62 is communicated, such as via wire or wireless, to a battery management unit (BMU) 70. For example, some systems may have a controller area network (CAN) bus; other communications designs and modes may also or alternatively be used. The BMU performs various estimations of battery and pack status, and sends commands to each CMU for actions such as cell balancing, cell voltage and temperature reporting. For example, state of charge (SOC) may be estimated using the battery voltage measurements and/or current monitoring. State of health (SOH) may be estimated using one or more of the internal resistances of the battery/battery cells, as well as data related to the amount of charge that can be held in the batteries, which will drop over time, and is determined using known methods such as tracking current flows into and out of the battery while also monitoring SOC based on cell voltage measurements. State of power (SOP) may be estimated and represents the instantaneous power output capability of the battery, which will relate to the SOC and the internal resistance, among other factors.

The BMU 70 may also communicate to heating and/or cooling systems associated with the battery pack to ensure safe and efficient operation. The BMU 70 in turn communicates to an electric control unit (ECU) 72 that operates at the vehicle level to make decisions and issue commands to the rest of the vehicle, as well as providing alerts to the driver/operator of the vehicle as to battery system status when needed.

The CMU 62, BMU 70, and/or ECU 72 may take many forms, including, for example, a microcontroller or microprocessor, coupled to a memory storing readable instructions for performing methods as described herein, as well as providing configuration of the CMU 62, BMU 70, and/or ECU 72 for the various examples that follow. The CMU 62, BMU 70, and/or ECU 72 may include one more application-specific integrated circuits (ASIC) to provide additional or specialized functionality, such as, without limitation a signal processing ASIC that can filter received signals from one or more sensors using digital filtering techniques. Logic circuitry, state machines, and discrete or integrated circuit components may be included as well. The skilled person will recognize many different hardware implementations are available for a CMU 62, BMU 70, and/or ECU 72. The controller 20 may be part of a computer provided as part of the overall system. The controller 20 may include, be part of, or communicate with an advanced control framework as disclosed in U.S. patent application Ser. No. 17/241,668, filed Apr. 27, 2021 and titled ADVANCED CONTROL FRAMEWORK FOR AUTOMOTIVE SYSTEMS, the disclosure of which is incorporated herein by reference.

While FIG. 1 and much of the discussion herein uses the vehicle context for a battery system, the present concepts are not limited to batteries. Other examples may include fixed systems having, for example, a battery pack comprising a plurality of battery cells, which may in turn be grouped into modules as shown in FIG. 2. These systems may be used in residential or commercial settings to store electrical power from renewable sources such as solar, and/or may be part of a grid infrastructure providing grid storage, for example.

Figure 3:
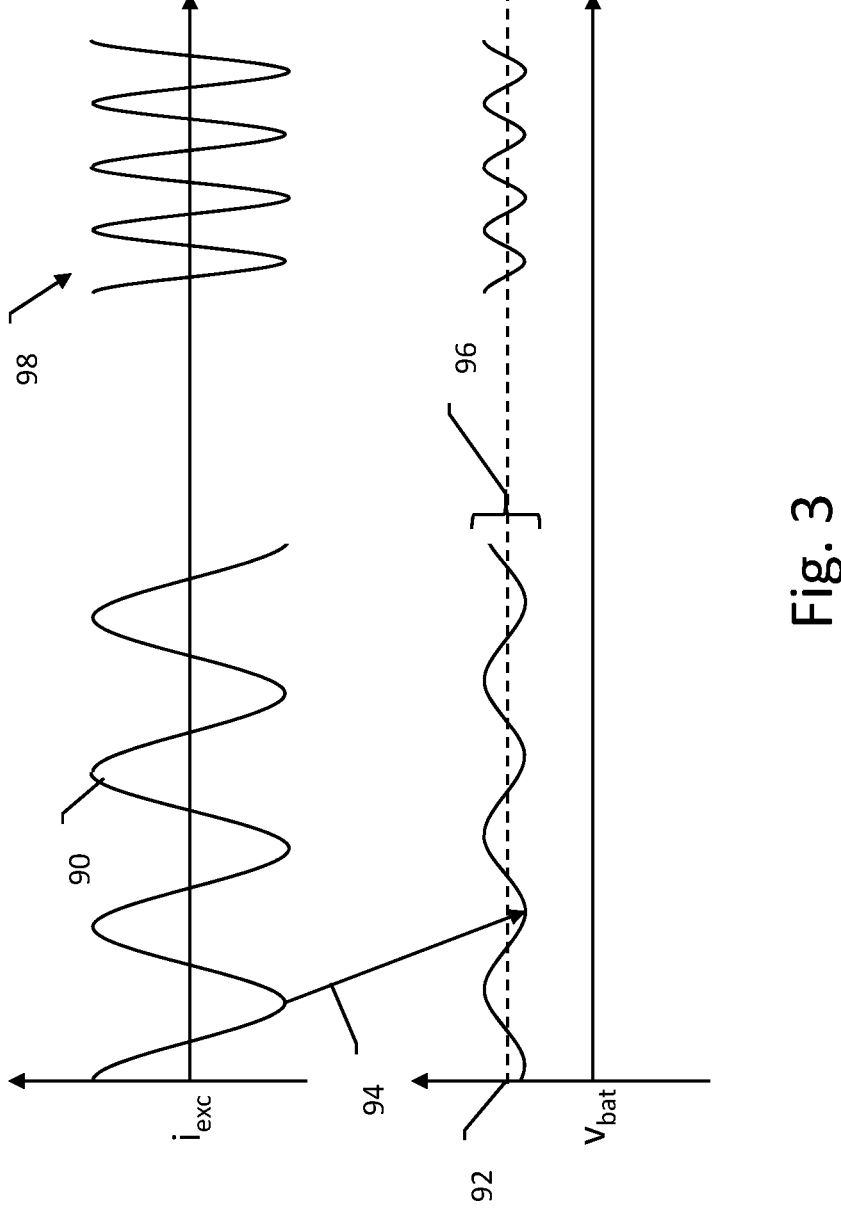
FIG. 3 illustrates current and voltage for EIS.

FIG. 3 illustrates current and voltage for electrochemical impedance spectroscopy (EIS). An excitation current, as shown at 90, is applied to a battery, causing perturbation shown at 92 about the battery OCV 94. The applied signal is an alternating current signal, though not necessarily a sinusoidal signal. As long as the applied signal 90 can be generated in repeatable manner, it can be used. A phase (shift) 94 will also be observed/measured in EIS. The responsive amplitude 96 and phase 94 are measured at a first frequency, and the test is applied again using another frequency, as illustrated at 98. Generally, at least two frequencies are used, though six or more frequencies may be preferred, or a frequency sweep of continuous change across a range may be used.

EIS has typically been limited to use in the laboratory environment, using high grade and expensive equipment. EIS may, for example, be used in failure analysis for EV batteries after such batteries are removed from the vehicle/ service. EIS may also be used in processes for analyzing battery designs as part of verification/validation activities and component qualification. However, EIS has not previously been made available on-board, that is, in the vehicle itself. EIS can use a potentiostatic method, in which a voltage perturbation is applied to a battery cell, and the corresponding current excitation is measured. This is a widely used technique in laboratory-based EIS, and may be referred to as PEIS. An alternative is a galvanostatic EIS (or GEIS), in which a current perturbation is applied, and the resulting potential is measured. The current perturbation may oscillate around zero amps, so that net current flowing to and from the battery is kept at zero.

Figure 4:
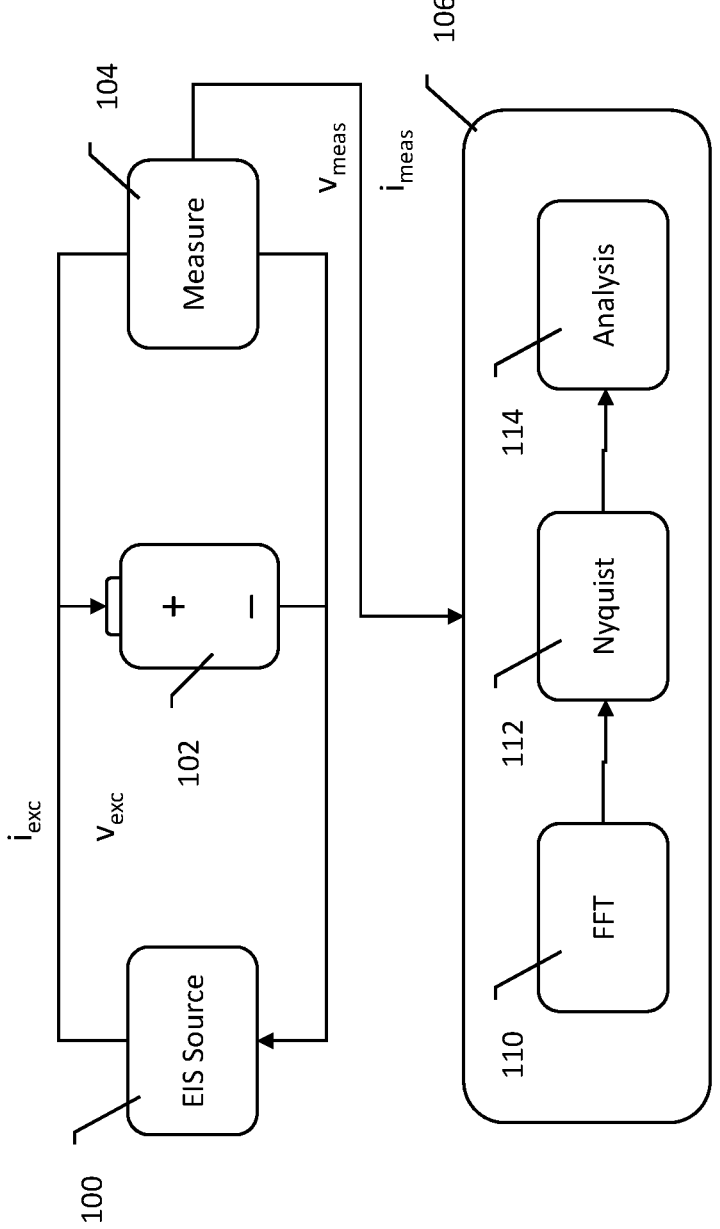
FIG. 4 is a block illustration of an EIS architecture.

FIG. 4 is a block illustration of an EIS architecture. An EIS source 100 provides an excitation signal to a battery 102. If GEIS is performed, the signal is an excitation current, $i_{exc}$. If PEIS is performed, the signal is an excitation voltage $v_{exc}$. The signal applied is an alternating signal, referred to here as an AC current (for alternating current signal) or an AC voltage (for alternating voltage signal). Measurements are performed by block 104. For GEIS, a measured voltage, Vmeas, is obtained; for PEIS, a measured current $i_{meas}$ is obtained. The measurement 104 occurs as the EIS source 100 sweeps through several frequencies or a range of frequencies for the AC signal being generated.

Characteristics of the excitation signal and measured signal are passed to an analysis block 106. A fast Fourier transform (FFT) is performed at 110, and the results populate a Nyquist plot 112. In this process, the complex impedance of a cell or set of cells may be calculated from the current and/or voltage measurement across the frequency sweep. The results are analyzed at block 114.

The analysis at block 114 may take several forms. For example, analysis 114 may simply be to compare parameters, FFT results, etc., across a block of similarly situated cells in a cell module to identify any outliers, indicative of possible failure of any outlier cells. If there are no outliers, the cell module may be deemed as operational. Analysis 114 may compare each cell to stored data based on cells from controlled or laboratory testing, to determine whether cells are performing and/or aging appropriately. Analysis 114 may instead be used to determine the current state of a cell. EIS may be highly useful for this purpose because EIS enables insight into the internal electrochemical processes and allows ohmic resistance, charge transfer resistance and double layer capacitance, among other characteristics, to be at least indirectly observed. If a lithium chemistry is used in the cell, for example, the EIS may also provide an understanding of lithium plating characteristics.

EIS may be augmented by the use of a distribution of relaxation times (DRT) method. DRT is an analysis method for converting impedance data as functions of frequency into a distribution of the time constants in the considered system. DRT can be used to put parameters (time constants, resistance and/or capacitance) into the equivalent circuit for a given system. For example, rechargeable lithium batteries can be modeled using a range of different equivalent circuits, from very a basic resistive model, to first or second order Thevenin electric models, and, most likely for the present examples, the Accurate Electrical Equivalent Model. These may include, for example, one or several series RC circuits, as well as other model components. DRT can be used to apply EIS results to the battery model for a given battery type and build. Chemical traits and structural design at each of the anode, cathode, and electrolyte can be used to select which components of the equivalent model should be understood as being represented in EIS measurements.

A challenge for use in a vehicle is finding ways to perform EIS that are not cost prohibitive or overly power hungry.

Other challenges may exist as well, such as whether and/or when to perform EIS, that is, whether unloaded conditions (parked), loaded (driving), or even during battery charging.

Figure 5:
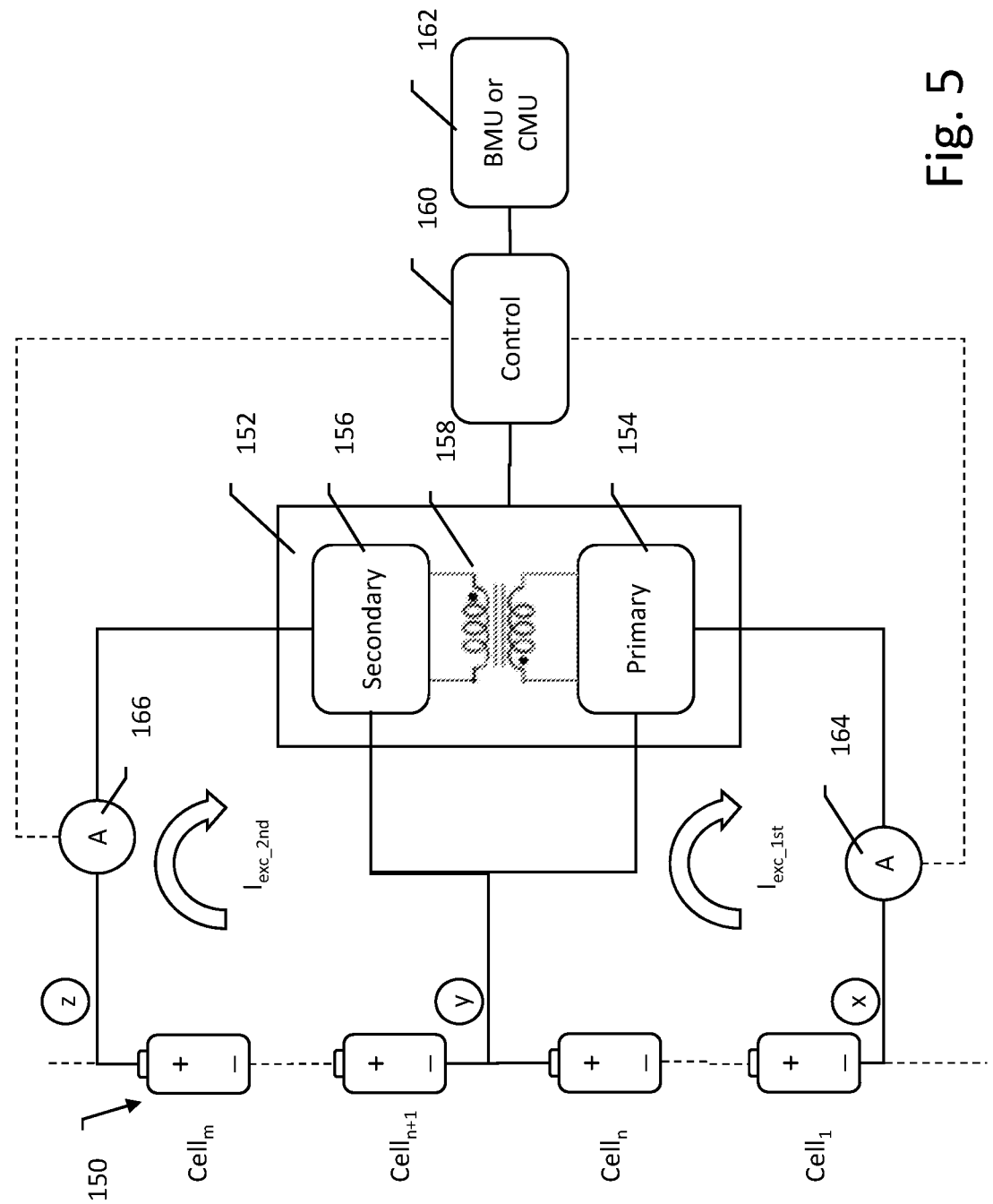
FIG. 5 shows an illustrative on-board EIS circuit.

FIG. 5 shows an illustrative on-board or on-line EIS circuit. A series of battery cells are shown at 150, including cells 1 to n, and cells n+1 to m. For example, n may be ten (10) and m may be twenty (20); the number of cells in each side may be equal, or unequal, as desired. Three inputs to the EIS circuit are thus defined—inputs x and y connect to a first battery circuit shown as cells 1 to n, and inputs y and z connect to a second battery circuit shown as cells n+1 to m. The EIS circuit 152 includes primary side circuitry 154 coupled to inputs x and y, and secondary side circuitry 156 coupled to inputs y and z. The primary side circuitry 154 controls current flow through the primary of a transformer 158, and the secondary side circuitry 156 controls current flow through the secondary side of transformer 158.

An overall control block 160 is communicatively linked to a BMU or CMU 162, and also linked to current sensor 164 (in a primary side current loop that is coupled to the first battery circuit, cells 1 to n, as well as the primary side circuitry 154 and the primary coil of the transformer 158) and current sensor 166 (in a secondary side current loop that is coupled to the second battery circuit, cells n+1 to m, as well as the secondary side circuitry 156 and the secondary coil of the transformer 158). The current sensors 164 and 166 are used to measure currents in each loop, current, and may allow closed loop control over excitation current amplitude/magnitude, as desired. Through not shown, each of nodes x, y and z may include a voltage sensor, or there may be voltage sensors at each of the battery cells 150. Also the system may include, as previously indicated, cell temperature measurement sensors as well as cell balancing circuits (active, or more typically, passive), and the communication to the BMU or CMU 162 will be performed with electrical isolation measures in place, as are known in the art.

One operation using the design may take power from one set of battery cells (for example, those of the primary side current loop, that is, cells 1 to n) and use that power to generate the excitation current applied to the other set of battery cells (initially, those of the secondary side current loop, that is, cells n+1 to m). The circuitry here can be switched as well to then allow the reverse, without needing to stop and dissipate the energy in the circuit, obtaining power from the secondary side current loop, cells n+1 to m, to supply the excitation current for the primary side current loop, cells 1 to n. This configuration minimizes ohmic losses in the circuit to those occurring at the battery cells due to internal impedance, and any stray, parasitic, or conductor resistances encountered. Some minimal heating (loss) will also occur in the transformer 158. In some examples, the quantity of energy transferred from the first group of cells to the second group of cells is approximately equal to the quantity of energy transferred back to the first group of cells, that is, within 90%, or 95%, or 98% in several examples. In some examples shown below, the parts count needed for this system can be quite low, as simple FET switches are used in circuits 154 and 156 with pulse width management (PWM) to control current amplitudes. Other switch types (bipolar junction transistors, etc.) may be used as desired.

In an illustrative example, the EIS measurement system may be designed to excite individual battery cells or sets of battery cells arranged in series or parallel, and provide an excitation current sufficient to cause a cell voltage ripple in the range of about 2 mV to about 5 mV. The current needed would depend on various factors including cell type, capacity and/or quantity, for example. For example, some battery module designs have parallel strings of battery sells, connected together in series, and cell voltage measurement may be performed at the parallel string level. The excitation current may be limited by different operating conditions; for example, excitation current may be reduced when the surface temperature of the battery exceeds a predefined threshold. The range of frequency in some examples may be about 1 Hz to about 800 Hz, with anywhere from three to twenty (or less or more more) test frequencies, for example, ten test frequencies may be used. Synchronized measurement of current and voltage may be a feature as well. The demands of a given battery pack and installation will drive the needed accuracy and/or resolution of any voltage and/or current measurement.

Additional details of an onboard EIS system as shown in FIG. 5, as well as additional or alternative designs, are disclosed in U.S. patent application Ser. No. 18/498,996, filed Oct. 31, 2023, titled SYSTEM AND METHOD FOR ONLINE ELECTROCHEMICAL IMPEDANCE SPECTROSCOPY MEASUREMENT IN A BATTERY, the disclosure of which is incorporated herein by reference. That system or other EIS systems may be used in the examples herein to generate excitation signals and/or measure responses, as desired.

Figure 9:
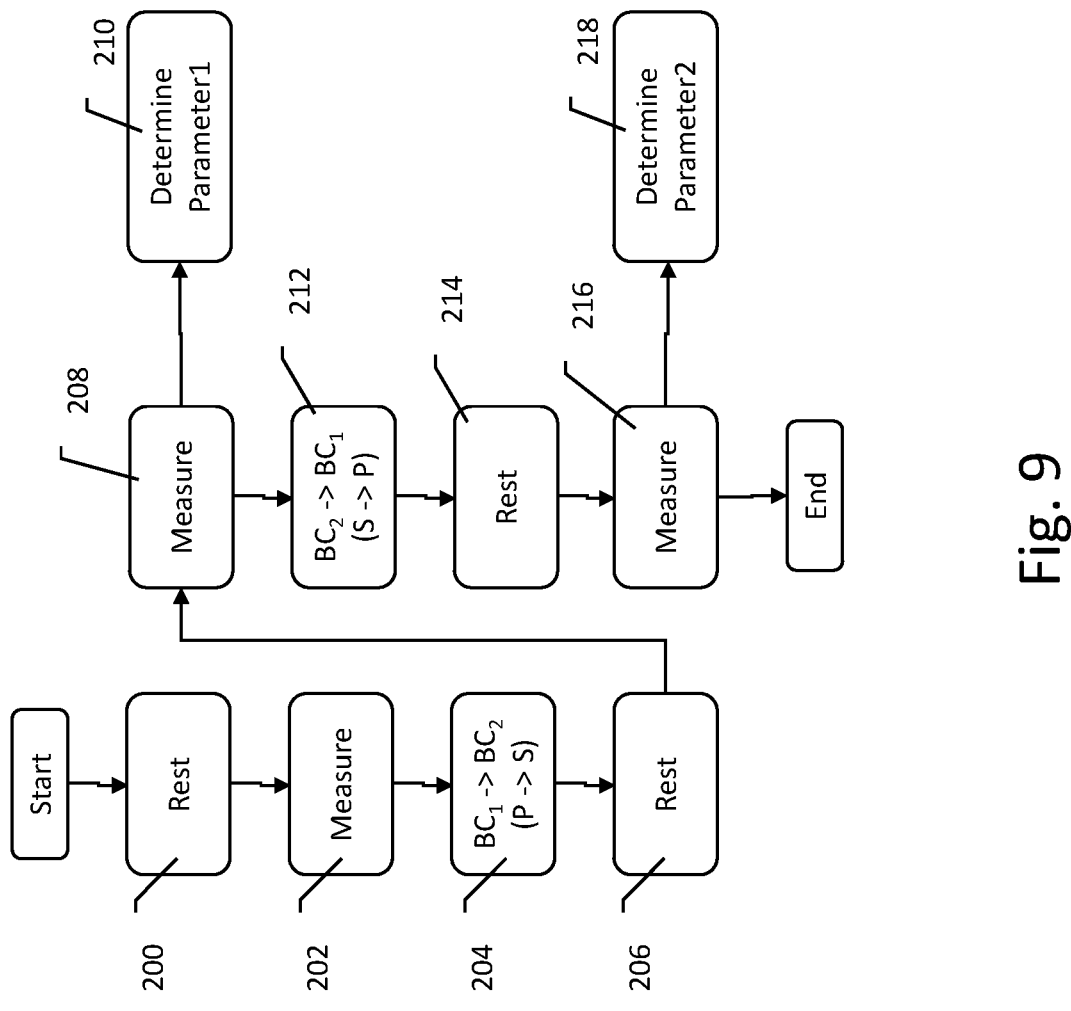
FIGS. 9-10 show illustrative methods in block form.

In some examples, as illustrated in FIG. 9, below, a circuit as shown in FIG. 5 may be used to generate the signal, using one portion of a battery pack to power examination of another portion of a battery pack. Rather than the EIS approach shown above, the circuit may instead be used to deliver a known quantity of current from the first portion of the battery pack (a first battery circuit, comprising one or more cells of the battery pack), to a second portion of the battery pack (a second battery circuit, comprising one or more other cells of the battery pack). By using the circuit shown in FIG. 5, as well as other on-board EIS circuits shown in U.S. patent application Ser. No. 18/498,996, minimal power is used.

In other examples, an onboard charger (OBC 42 in FIG. 1) may use an externally supplied mains signal (such as 50 Hz AC in Europe, or 60 Hz AC in the United States, or other local mains signal or other power signal, which may be AC or DC depending on the setting) as a power supply, and be commanded or manipulated to provide the signal as shown. In still other examples, the system controller (block 20 in FIG. 1) may request a signal as shown from a charging station (block 40 in FIG. 1).

Figures 6, 7:
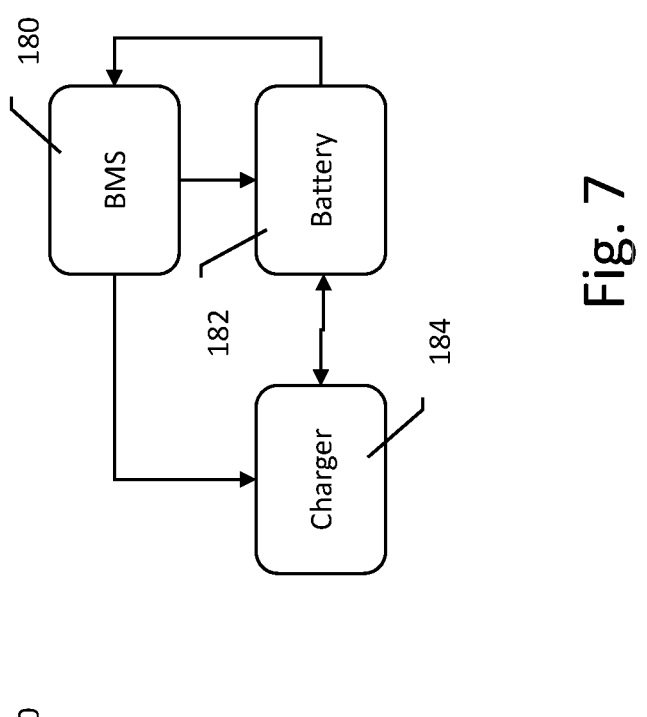
FIGS. 6-7 show charger-based configurations.

FIG. 6 shows one configuration. A BMS 180 controls an OBC 172 to deliver a controlled or known quantity of current to a battery 176, using power from an external source 174. The external source may be a mains supply, or may be a different source such as a stored power device. For example, the external source 174 may be an external battery coupled to a residential or commercial solar power array or system, where the external battery stores power during the day for use in recharging the battery 176 at night, as is known in the industry. The OBC 172 may operate using a charging mode generally, and when it is desired to perform a battery parameter test, the BMS 170 may command a special mode operation, as desired. Measurements may be read from the battery as indicated by the line and arrow on the right side of the drawing.

FIG. 7 shows another configuration. Here, BMS 180 communicates with an external charger 184 to charge the battery 182. The external charger 184 may be at a charging station, for example. The charger 184 may operate using a standard charging mode generally, including, if desired, fast or high current charging (greater than 1C, for example).

When it is desired to perform a battery parameter test, the BMS 180 may command a special mode operation from the charger 184. Measurements may be read from the battery as indicated by the line and arrow on the right side of the drawing.

Figure 8:
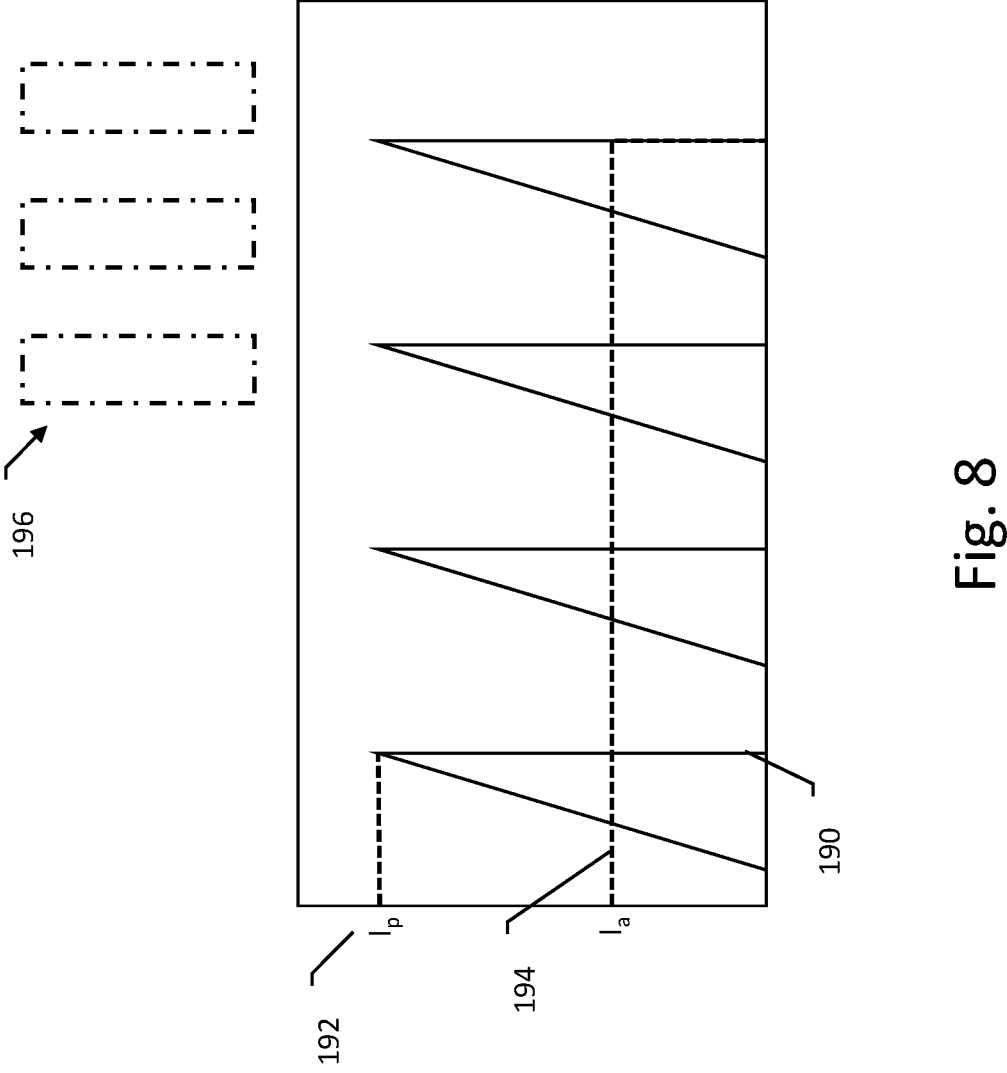
FIG. 8 illustrates a current output in graphical form.

FIG. 8 illustrates a current signal that can be used to further interrogate or examine a battery cell, or a battery circuit having one or more cells connected together (in series, parallel, or series and parallel), or an entire battery pack. A triangular waveform is shown at 190, with a peak current at $I_p$, 192. The average current, $I_a$ is shown at 194. By controlling the duty cycle of the waveform 190, as well as the on-duration, each of the peak and average currents can be controller. The total current is then known as well, and so a controlled current dose is delivered with each set of pulses 190. The average current $I_a$ 194, multiplied by time, yields a known quantity of charge. Other waveform shapes can be used, including rectangular or square waves, as illustrated at 196. A sinusoid, with a DC offset, may be used, if desired. Pulse wave modulation and/or other techniques can be used to obtain a desired average and/or total current.

In some examples, the waveform as shown in FIG. 8 represents a series of current pulses generated, for example, at 100 kHz, with each pulse having a duration of 3 microseconds, and a maximum current of 10 Amperes, providing an average current draw of 3 Amperes. The total duration may be, for example, sixty seconds. By making the duration relatively long, in comparison to the individual pulses, the fact that the output is not a single square wave has little effect on the resultant measurement. In addition, as long as the pulse can be repeatably generated with the same waveform, the test results can be calibrated to ensure reliability; that is, the precise nature of the pulse waveform is less important than ensuring that the same waveform will be generated each time it is used to deliver the known quantity of charge to the battery cells under test. The frequency can vary, for example, between 1 kHz and 1 MHz, or 30 kHz to about 200 kHz, and may be dependent on particular design choices for a given hardware build. Likewise, pulse width and shape, and any other desired parameters can vary for a given implementation.

For pulse generation as shown in FIG. 8, the BMS in the system (or another controller if desired) may set the needed parameters to define the known quantity of current to be delivered. These may include peak amplitude, frequency, duty ratio, duration, and, as described below in FIGS. 9 and 10, rest period.

FIG. 9 shows an illustrative example, using the circuit of FIG. 5 to transfer a known quantity of charge from a first portion of the battery pack (a first battery circuit, comprising one or more cells of the battery pack), to a second portion of the battery pack (a second battery circuit, comprising one or more other cells of the battery pack). In some examples, the charge quantity into and out of each portion of the battery pack or battery circuit is substantially the same. In some examples, the quantities of current passing from one battery circuit to another battery circuit may be considered substantially equal in some examples, if the difference in charge quantity is within about 3% or less of the delivered charge quantity.

In the example, the first battery circuit, which represents one or more cells of the battery pack (for example, cells n+1 to m in FIG. 5), is held in a rest state at block 200. For a predetermined period of time, or at least a minimum period of time, the first battery circuit is isolated with no current flow into or out of the first battery circuit. The rest duration may be, for example, 1 minutes to 1 hour, or more or less, for determination of battery state of health and/or battery capacity, for example. Thus rest duration at block 200 (as well as the later rests at 206 and 214) may range from a few seconds up to an hour, as desired. The rest duration may be adjusted up or down based on the desired battery parameter to test, as well as based on any prior battery usage/current draw. For example, after a period of heavier usage, as when the vehicle is being driven on battery power, a longer period of rest may be used, while light usage may only require a shorter period of rest. Thus rest at block 200 may be relatively longer than the later rest periods at 206, and/or 214, if desired and suitable to the application.

Open circuit battery voltage of the first battery circuit is then measured at block 202. A known quantity of charge is then delivered to the first battery circuit, as indicated at 204. In the example, two battery circuits (similar to FIG. 5) are used, with current flowing from the first battery circuit, $BC_1$, to the second battery circuit, $BC_2$ at block 204. A rest period follows as indicated at 206. Next another open circuit voltage measurement is taken from the first battery circuit, as indicated at 208. At this point, a first battery parameter for the first battery circuit can be calculated, as indicated at 210. For example, battery capacity may be estimated using the known charge quantity supplied/delivered to the first battery circuit at 204, and the two measured voltages from 202 and 208, applied to an inverted open circuit battery model as further discussed below.

Noting again that FIG. 9 considers only two battery circuits, assuming the second battery circuit is also subject to the rest period at 206, the second battery circuit open circuit voltage can also be measured at block 208. Then a reverse pulse delivery occurs at 212, in which the known quantity of current is returned from the first battery circuit to the second battery circuit. This returns both battery circuits to substantially their initial state. Another rest period follows, at 214, and the open circuit battery voltage is measured at 216. A battery parameter for the second battery circuit is then determined, as indicated at 218. For example, battery capacity may be estimated using the known charge quantity supplied/delivered to the first battery circuit at 212, and the two measured voltages from 208 and 216, applied to an inverted open circuit battery model as further discussed below.

While FIG. 9 considers two battery circuits, more may be used, and the sequence may be in a daisy-chain. For example, if there are four battery circuits, $BC_1$, $BC_2$, $BC_3$, and $BC_4$, a sequential approach may go as follows:

$BC_1 \rightarrow BC_2$, then $BC_2 \rightarrow BC_3$, then $BC_3 \rightarrow BC_4$, finally $BC_4 \rightarrow BC_1$ Other sequences may be used, as desired. As illustrated in FIG. 5, each of the "battery circuits" may simply be a subset of the cells included in a given battery pack, where the individual battery cells may be connected in series or in parallel. Thus "circuit" in "battery circuit" simply means the battery cells therein are connected to one another, and no particular structure or quantity (other than there being at least one battery cell in a battery circuit) is required.

In some examples, a troubleshooting mode may be enabled in which different size battery circuits can be defined. For example, if there are 32 battery cells, divided into 4 battery circuits for standard analysis, if a problem (reduced capacity outside of a modeled or expected range, for example) is identified in one of the 4 battery circuits, then the 8 battery cells in the problem battery circuit may be analyzed at a more granular level, such as individually or in pairs, in a troubleshooting mode, if desired.

One of the battery parameters that is determined, in some examples, is battery capacity. The capacity measurement is an estimation problem as the capacity is not a directly measurable quantity. Battery capacity might be measured or estimated during a charge procedure from low (zero) charge (minimum cell voltage) to full charge (maximum cell voltage), however such an approach may be impractical as full discharge and full charge states may not arise frequently for a given vehicle. Instead, a current pulse charge/discharge method can be used. During a zero current condition, the (open circuit) terminal voltage is read at time instance $k_1$, and the State of Charge (SOC), $z_{k1}$, is estimated using the measured open circuit voltage (OCV) A known quantity of charge is added, sufficient to cause a change in the battery voltage sufficient to limit the effects of any measurement noise. A relaxation period is taken after the end of pulse event to reach the steady state. Again, the (open circuit) terminal voltage is read, now at time instance $k_2$, and the State of Charge (SOC), $z_{k2}$, is estimated using the measured open circuit voltage (OCV). The measurement may be repeated as well after the added charge from the pulse is removed, to provide additional data to the measurement; however, it may be sufficient to only read the open circuit voltage before and after the charge pulse; the third measurement can be included or omitted as desired.

The capacity measurement can be given, in some examples, as a linear estimation problem through all measured current pulses as:

$$\begin{bmatrix} -\sum_{k=k_1}^{k_2} \eta_k i_k \\ -\sum_{k=k_2}^{k_3} \eta_k i_k \\ \vdots \\ \vdots \end{bmatrix} = \begin{bmatrix} z_{k2} - z_{k1} \\ z_{k3} - z_{k2} \\ \vdots \end{bmatrix} Q$$

Where $\eta_k$ is the battery charging/discharging efficiency, each $k_i$ is a time instance, each $i_k$ represents a current applicable during the time instance (the equation assumes current is always the same but that need not be the case), each $z$ is the OCV-based estimate of SOC at the noted time instance, and $Q$ is the estimated battery capacity. The BMS may maintain a record of several measurements taken over the life of the battery (or such records may be stored on a remote server), allowing tracking of the capacity over time to identify any sudden changes. A sudden change, or a change that is different from a modeled progression of changes, can be flagged as an error condition, leading to an alert, maintenance, etc. as desired.

Figure 10:
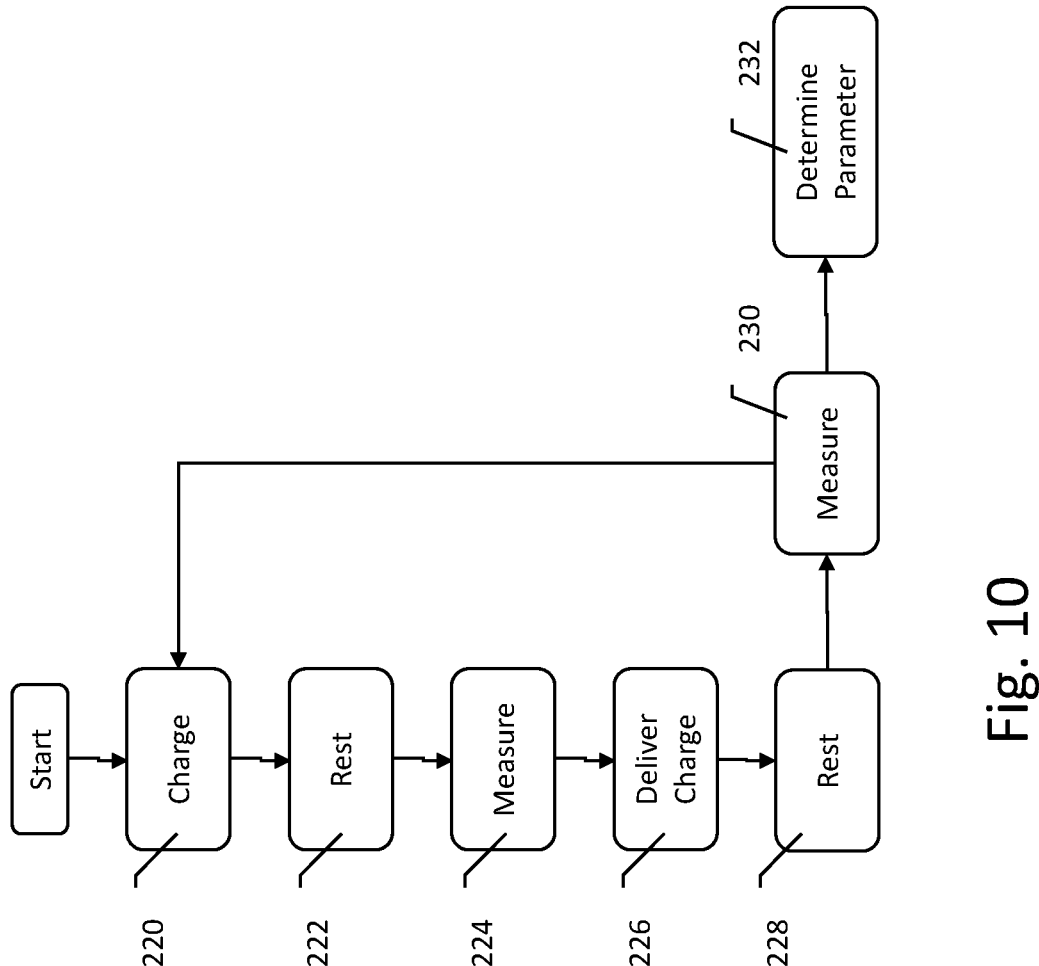

FIG. 10 shows another illustrative example, here using either the OBC or an external charging station, either of which can receive control signals from the BMS (or another controller in the vehicle) to issue known charge quantities to a battery cell, a battery circuit, or a battery pack, as the case may be. In some examples, if an external charger is used in particular, the entire battery pack may be tested as one unit. The method starts, optionally, with charging the battery pack at 220 until at least a threshold minimum charge is present on the pack. For example, if a battery model is used, it may be desirable to have the battery pack, circuit, or cell in a known state of charge to limit process noise. For example, a minimum charge level of 20% to 60% of maximum charge may be used, if desired. Step 220 may instead be omitted.

At 222, a rest period is enforced, in which the battery pack, circuit or cell is not subject to current input or outputs for a set period of time (a "rest duration"). The rest duration may be as short as a few tens of seconds but may range up to an hour. Other time frames can be used. Next, the battery open circuit voltage is measured, as indicated at 224. Any suitable voltage measuring apparatus, device, circuit or process can be used; it may be preferred to measure battery voltage using a high impedance device to prevent current flow.

Next, a predetermined quantity of charge is delivered to the battery pack, circuit or cell, as indicated at 226, and another rest period is enforced at 228. The predetermined quantity of charge is delivered by generating an average current for a set period of time. The average current is preferably less than 1C (where 1C is a charge current that would allow the battery would reach full nominal capacity in one hour from a fully discharged state), in some examples, about 0.05C to about 0.5C, or about 0.1C to about 0.3C, or about 0.2C, issued for a period of a few seconds up to a few minutes, for example, 10 seconds to 3 minutes, or about 30 to 90 seconds, or about one minute, as desired.

After the rest period 228, battery open circuit voltage is again measured at 230, and the battery parameter is then determined at 232, including for example, the battery capacity. The method may return to block 220 to finish charging the battery to a desired maximum, if desired. The following equation can be used to characterize the activity:

$$i_{noise} - \sum_{k=k_1}^{k_2-1} \eta_k i_k = (z_{k2} - z_{k1})Q + SOC_{noise}$$

Where $\eta_k$ is the battery charging/discharging efficiency, each $k_i$ is a time instance, each $i_k$ represents a current applicable during the time instance (the equation assumes current is always the same but that need not be the case), each z is an estimate of the SOC determined from measured OCV at the noted time instance, and Q is the estimated battery capacity. Further, the current noise measured by the current sensor is denoted at $i_{noise}$ and the state of charge noise is indicated as $SOC_{noise}$, each of which relate to the measurement noises and any noise internal to the process. The estimation and noise handling may be performed using any suitable algorithm, such as least-square based minimization algorithms, including for example a Kalman filter, a recursive least square estimation method, etc.

Figure 11:
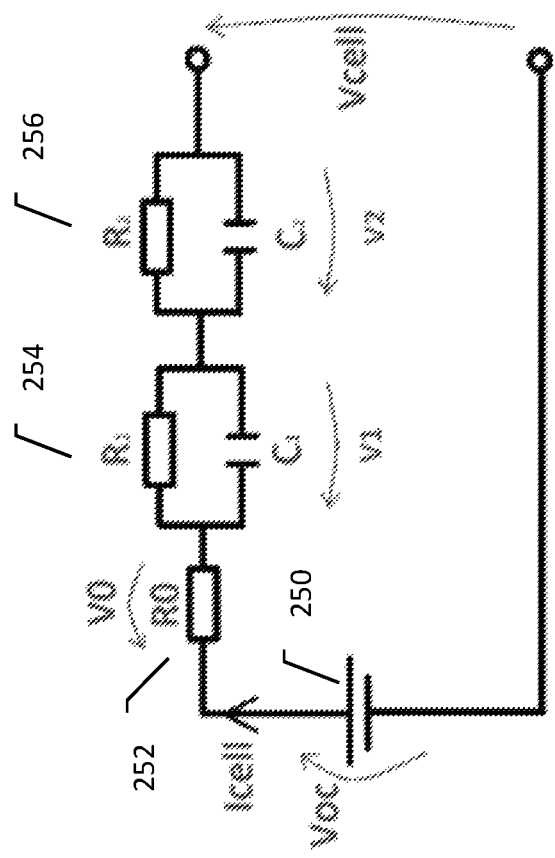
FIG. 11 shows an illustrative battery model.
Figure 12:
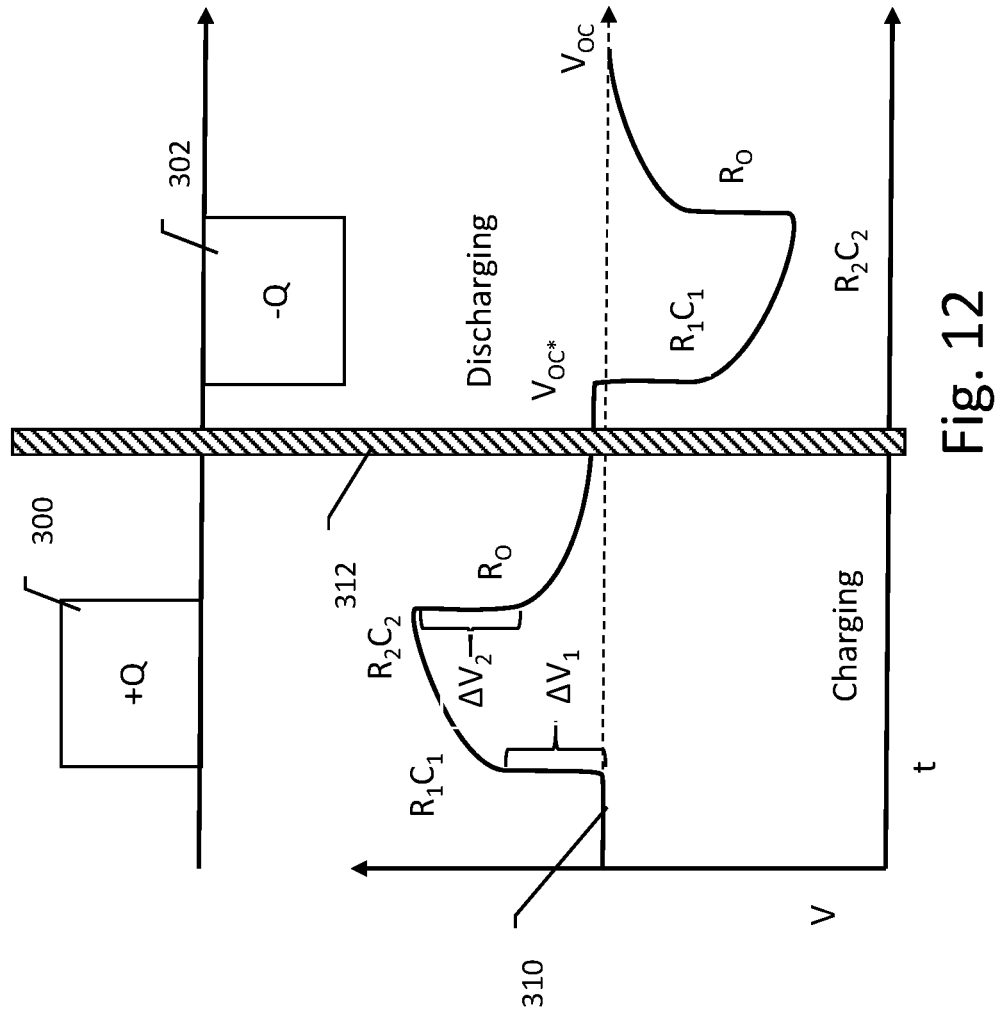
FIGS. 12-13 graphically show illustrative charging and discharging curves.

In each of FIGS. 9 and 10, in addition to the open circuit voltage measurements after a rest period, battery voltage may be sampled a plurality of times during charging and during the rest period. FIGS. 11-12 are useful to understand how such measurements can be used. In FIG. 11, a second order equivalent circuit model for the battery is illustrated. The model includes an open circuit voltage, $V_{OC}$, and provides a cell voltage, $V_{cell}$ after attenuation as the cell current, Icell passes through a resistance, $R_0$, and after passing through two RC circuits at 254, 256, each applying a respective voltage, $V_1$, $V_2$.

Turning next to FIG. 12, the upper portion of the figure shows a positive charge applied to a battery pack, circuit or cell at 300, followed by a period of inactivity including a rest period at 312 (intended to cover a longer time period of minutes up to an hour), and a subsequent extraction of the same quantity of current at 302, which is optional. The measurable voltage is shown at 310 for the battery pack, circuit or cell. When the charge is injected, the voltage 310 has a steep upward excursion from the original open circuit voltage ($V_{OC}$), and then illustrates a curvature upward over time until the end of the period of charge being applied. A first portion of this curve is characterized by the first of the RC circuits shown in FIG. 11, at 254, thus $R_1C_1$ are noted. As the current flow continues into the battery pack, circuit or cell, a second portion is characterized by the second of the RC circuits shown in FIG. 11, at 256, thus $R_2C_2$ are noted. To provide this level of detail, the voltage across the battery pack, circuit or cell may be sampled, for example, at intervals in the range of ten (10) microseconds to ten (10) milliseconds, or more or less frequently. When the current flow into the battery pack, circuit or cell stops, the voltage 310 drops quickly again. The vertical height of the change in voltage at the start and stop of the current pulse will provide an understanding of $R_0$, as follows:

$$R_0 = (\Delta V_1 + \Delta V_2)/2 * i_{av}$$

Where the two V terms are as shown in FIG. 12, and $i_{av}$ is the average current supplied during the current pulse. Other approaches to extracting measurements and the characterization may be used. During the optional discharging step, a similar process can be used to obtain further data points. At the end of the charging step, the open circuit voltage measurement is taken as $V_{oc*}$. The difference between $V_{oc}$ and $V_{oc*}$ provides an indication of the battery capacity.

The calculation of R0 shown above may be applicable to relatively short pulse durations in the range of up about ten milliseconds, though longer durations up to one hundred milliseconds may be used as desired. Longer duration pulses may be used to obtain the charging resistance and/or discharging resistance, which is relevant to an estimate of state of power and/or power limits for a battery.

Power limit predictions allow a prediction of the maximum discharge and/or charge currents for a given battery/pack. The discharge and charge relationships (referring in the following to the magnitude of power and current when indicating maximums) may be represented by these equations:

$$i_{max,k}^{dis,V} = \frac{OCV(z_k) - v_{min}}{R_{dis}(z_k)}$$

$$i_{max,k}^{chg,V,} = \frac{OCV(z_k) - v_{max}}{R_{chg}(z_k)}$$

Where the first equation illustrates the maximum discharge current which is estimated by dividing the open circuit voltage measurement, less a minimum voltage to be maintained, divided by the discharge resistance. The second equation illustrates the maximum charge current which is estimated by dividing the open circuit voltage measurement, less a maximum allowable voltage, divided by the charge resistance.

The power limits can then be determined based on these formulas:

$$p_{max,k}^{dis,V} = v_{min} i_{max,k}^{dis,V}$$

$$p_{max,k}^{chg,V} = v_{max} i_{max,k}^{chg,V}$$

15

The power limits reflect the fact that charging or discharging a cell at a high-power level will accelerate cell degradation and may cause premature battery-pack failure. The above power limits provide a reasonable estimate of how much power may be available over a subsequent time period without causing premature degradation, where the time period may be, for example, in the range of a few tens of seconds.

Figure 13:
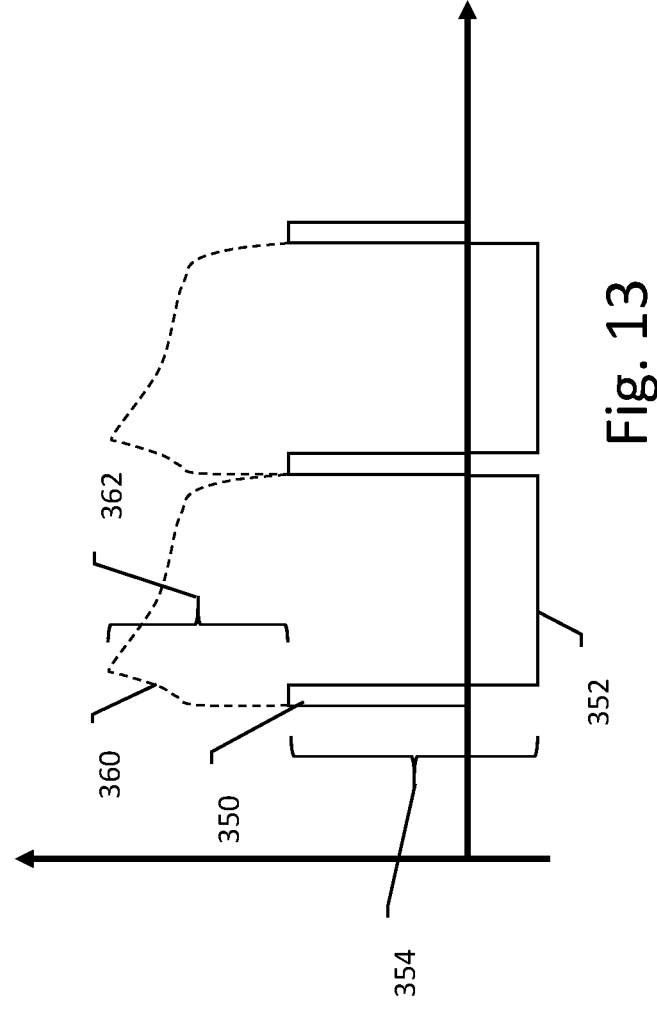

FIG. 13 shows an illustrative set of measurements of voltage and current used to estimate maximum power limits. Current pulses are shown at 350 and 352, with alternating higher current pulses 350 of relatively short duration, and longer, lower current pulses 352 of opposite polarity. The pulses are not necessarily shown in correct proportion to one another; the pulses may be charge balanced in some examples. For example, a positive pulse of 2.5 A may be applied at 350, and a negative pulse of 0.5 A may be applied at 352, where the positive pulse duration is five times that of the negative pulse. The pulses do not need to be balanced, however. In an example, each positive pulse 352 is generated ten second after the prior pulse; other inter-pulse durations can be used as desired including longer or shorter durations. The inter-pulse period may be treated as the duration for which a maximum power estimate is applicable. When positive pulses are used as the short duration, larger amplitude pulses, the charging resistance would be determined; negative pulses may be used to estimate discharging resistance.

The voltage response of the battery pack is measured and shown at 360. With each transition from negative pulse 352 to positive pulse 350, a voltage change occurs, as shown at 362. The current transition is also noted, at 354. Then:

$$R_{x10} = \frac{\Delta V}{\Delta I}$$

Where Rx10 can be either the discharge resistance or charge resistance, depending on polarity of the current pulse, and ΔV is the voltage change at 362, and ΔI is the current change of the pulse for the next 10 seconds, at 354 in FIG. 13.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls. The terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. A method of estimating a first battery parameter for a first battery circuit in a battery pack, the battery pack also including a second battery circuit, the method comprising:
   with the first battery circuit at a first state of charge, enforcing a first zero current period in which the first battery circuit is neither charged nor discharged from the first state of charge;
   at the end of the first zero current period, obtaining a first battery voltage measurement from the first battery circuit;
   delivering to the first battery circuit a first known quantity of charge by issuing pulses of current to the first battery circuit from the second battery circuit;
   enforcing a second zero current period in which the first battery circuit is neither charged nor discharged;
   at the end of the second zero current period, obtaining a second battery voltage measurement from the first battery circuit;

determining the first battery parameter using an inverted open circuit voltage model, the first and second battery voltage measurements, and the first known quantity of charge.

2. The method of claim 1, further comprising determining a second battery parameter for the second battery circuit, the method comprising, after determining the first battery parameter:

at the end of the second zero current period, obtaining a third battery voltage measurement from the second battery circuit, wherein the second battery circuit is neither charged nor discharged during the second zero current period;

delivering to the second battery circuit a second known quantity of charge by issuing pulses of current from the first battery circuit to the second battery circuit;

enforcing a third zero current period in which the second battery circuit is neither charged nor discharged;

at the end of the third zero current period, obtaining a fourth battery voltage measurement from the second battery circuit;

determining the second battery parameter using an inverted open circuit voltage model, the third and fourth battery voltage measurements, and the second known quantity of charge.

3. The method of claim 2, wherein the first known quantity of charge is substantially equal to the second known quantity of charge.

4. The method of claim 1, wherein the first battery parameter is a battery state of health.

5. The method of claim 1, wherein the first battery parameter is a battery capacity.

6. The method of claim 1, wherein the first state of charge is known.

7. The method of claim 1, wherein the first state of charge is unknown.

8. The method of claim 1 wherein the step of delivering to the first battery circuit a first known quantity of charge by issuing pulses of current to the first battery circuit from the second battery circuit is performed using a transformer having a primary and a secondary, wherein one of the first battery circuit and the second battery circuit is coupled to the primary, and the other is coupled to the secondary.

9. The method of claim 1, wherein the battery pack is a component of a vehicle having an electric motor drive, and the pulses of current are issued by a circuit contained in the vehicle.

10. A method of estimating a battery parameter, the battery including at least a first battery circuit comprising one or more battery cells, the battery being a component of a vehicle having an electric motor drive and an onboard charging circuit configured to receive a power signal from a power source external to the vehicle and convert the power signal to a charging signal for use in charging the battery, the method comprising:

with the first battery circuit at a first state of charge and with the vehicle coupled to power source, enforcing a first zero current period in which the first battery circuit is neither charged nor discharged from the first state of charge;

at the end of the first zero current period, obtaining a first battery voltage measurement from the first battery circuit;

delivering to the first battery circuit a known quantity of charge by issuing pulses of current to the first battery circuit from the onboard charging circuit;

enforcing a second zero current period in which the first battery circuit is neither charged nor discharged;

at the end of the second zero current period, obtaining a second battery voltage measurement from the first battery circuit; and determining the battery parameter for the first battery circuit using an inverted open circuit voltage model, the first and second battery voltage measurements, and the known quantity of charge.

11. The method of claim 10, wherein the first battery circuit comprises the entire battery.

12. The method according to claim 10, further comprising the steps of charging a battery by, prior to the first zero current period, using the onboard charging circuit to charge the first battery circuit until a threshold battery voltage is reached, and then, in response to reaching the threshold battery voltage, initiating the method.

13. The method of claim 10, wherein the battery parameter is a battery state of health of the first battery circuit.

14. The method of claim 10, wherein the battery parameter is a battery capacity of the first battery circuit.

15. A method of estimating a battery parameter, the battery including at least a first battery circuit comprising one or more battery cells, the battery being a component of a vehicle having an electric motor drive, the vehicle being couplable to an external charger, the method comprising:

with the first battery circuit at a first state of charge, enforcing a first zero current period in which the first battery circuit is neither charged nor discharged from the first state of charge;

at the end of the first zero current period, obtaining a first battery voltage measurement from the first battery circuit;

delivering to the first battery circuit a known quantity of charge by issuing pulses of current to the first battery circuit from the external charger;

enforcing a second zero current period in which the first battery circuit is neither charged nor discharged;

at the end of the second zero current period, obtaining a second battery voltage measurement from the first battery circuit; and determining the battery parameter for the first battery circuit using an inverted open circuit voltage model, the first and second battery voltage measurements, and the known quantity of charge.

16. The method of claim 15, wherein the first zero current period and the second zero current periods each occur with the vehicle coupled to the external charger.

17. The method according to claim 15, further comprising the steps of charging a battery by, prior to the first zero current period, using the external charger to charge the first battery circuit until a threshold battery voltage is reached, and then, in response to reaching the threshold battery voltage, initiating the method.

18. The method of claim 15, wherein the battery parameter is a battery state of health of the first battery circuit.

19. The method of claim 15, wherein the battery parameter is a battery capacity of the first battery circuit.

* * * * *